(12) United States Patent
Yamagishi et al.

(10) Patent No.: US 11,781,033 B2
(45) Date of Patent: Oct. 10, 2023

(54) METHOD OF FORMING FIRST PROTECTIVE FILM

(71) Applicant: LINTEC Corporation, Tokyo (JP)

(72) Inventors: Masanori Yamagishi, Phoenix, AZ (US); Akinori Sato, Saitama (JP)

(73) Assignee: LINTEC Corporation, Tokyo (JP)

( * ) Notice: Subject to any disclaimer, the term of this patent is extended or adjusted under 35 U.S.C. 154(b) by 0 days.

(21) Appl. No.: 17/575,811

(22) Filed: Jan. 14, 2022

(65) Prior Publication Data

US 2022/0135828 A1 May 5, 2022

Related U.S. Application Data

(62) Division of application No. 15/769,189, filed as application No. PCT/JP2016/082505 on Nov. 2, 2016, now abandoned.

(30) Foreign Application Priority Data

Nov. 4, 2015 (JP) .................................. 2015-217111

(51) Int. Cl.
  *C09D 133/04* (2006.01)
  *C09J 163/00* (2006.01)
  (Continued)

(52) U.S. Cl.
  CPC ............ *C09D 133/04* (2013.01); *C08L 63/00* (2013.01); *C09J 4/06* (2013.01); *C09J 7/20* (2018.01);
  (Continued)

(58) Field of Classification Search
  CPC ....... C09D 133/04; C08L 63/00; C08L 33/00; C08L 2203/16; C08L 2203/20; C09J 4/06;
  (Continued)

(56) References Cited

U.S. PATENT DOCUMENTS

2009/0075429 A1 3/2009 Sato et al.
2009/0314417 A1 12/2009 Sasaki
(Continued)

FOREIGN PATENT DOCUMENTS

CN 1395604 A 2/2003
EP 2 985 328 A1 2/2016
(Continued)

OTHER PUBLICATIONS

International Search Report for PCT/JP2016/082505, dated Dec. 6, 2016, 3 pages.
(Continued)

*Primary Examiner* — Nathan L Van Sell
(74) *Attorney, Agent, or Firm* — Nixon & Vanderhye P.C.

(57) ABSTRACT

A curable resin film of the present invention forms a first protective film (1a) by attaching the curable resin film containing an epoxy-based thermosetting component having a weight-average molecular weight of 200 to 4,000 to a surface (5a) of a semiconductor wafer (5) having a plurality of bumps (51) with an average peak height (h1) of 50 to 400 μm, an average diameter of 60 to 500 μm, and an average pitch of 100 to 800 μm, heating the attached curable resin film at 100° C. to 200° C. for 0.5 to 3 hours, and curing the heated curable resin film, and when longitudinal sections thereof are observed by a scanning electron microscope, a ratio (h3/h1) of an average thickness (h3) of the first protective film (1a) at a center position between the bumps (51) to an average peak height (h1) of the bumps (51), and a ratio (h2/h1) of an average thickness (h2) of the first protective film (1a) at a position being in contact with the plurality of bumps (51) to the average peak height (h1) satisfy a relationship represented by the following expression of $[\{(h2/h1)-(h3/h1)\}\leq 0.1]$.

8 Claims, 4 Drawing Sheets

(51) Int. Cl.
*C09J 7/20* (2018.01)
*C09J 7/30* (2018.01)
*C09J 4/06* (2006.01)
*C09J 7/25* (2018.01)
*C09J 7/38* (2018.01)
*C08L 63/00* (2006.01)
*H01L 23/00* (2006.01)
*C09J 133/00* (2006.01)
*C08L 33/00* (2006.01)

(52) U.S. Cl.
CPC . *C09J 7/25* (2018.01); *C09J 7/30* (2018.01); *C09J 7/38* (2018.01); *C09J 163/00* (2013.01); *H01L 24/26* (2013.01); *C08L 33/00* (2013.01); *C08L 2203/16* (2013.01); *C08L 2203/20* (2013.01); *C09J 133/00* (2013.01); *C09J 2203/326* (2013.01); *C09J 2433/00* (2013.01); *C09J 2463/00* (2013.01); *H01L 2224/11* (2013.01); *H01L 2224/11515* (2013.01)

(58) Field of Classification Search
CPC ......... C09J 7/20; C09J 7/25; C09J 7/30; C09J 7/38; C09J 163/00; C09J 133/00; C09J 2203/326; C09J 2433/00; C09J 2463/00; H01L 24/26; H01L 2224/11; H01L 2224/11515; H01L 23/293; H01L 23/3128; B32B 3/30; B32B 27/06; B32B 2038/0076; C08J 5/18
See application file for complete search history.

(56) References Cited

U.S. PATENT DOCUMENTS

| | | |
|---|---|---|
| 2011/0030881 A1 | 2/2011 | Sasaki |
| 2011/0030882 A1 | 2/2011 | Mizuno |
| 2012/0098126 A1 | 4/2012 | Iwasaki |
| 2013/0244402 A1* | 9/2013 | Tsuchiyama .......... H01L 23/293 523/400 |
| 2014/0332984 A1 | 11/2014 | Inada |
| 2015/0035175 A1 | 2/2015 | Honda |
| 2015/0048495 A1 | 2/2015 | Honda |
| 2015/0225613 A1 | 8/2015 | Wakayama |
| 2018/0320029 A1 | 11/2018 | Yamagishi et al. |

FOREIGN PATENT DOCUMENTS

| | | |
|---|---|---|
| JP | 2005-028734 | 2/2005 |
| JP | 2012-156330 | 8/2012 |
| JP | 2012-244115 | 12/2012 |
| WO | WO 2014/021450 A1 | 2/2014 |
| WO | WO 2015/064574 A1 | 5/2015 |

OTHER PUBLICATIONS

Extended European Search Report dated Feb. 19, 2019 in European Application No. 16862096.1, 9 pages.
Chinese Office Action dated Mar. 17, 2020 in Chinese Application No. 201680060831.5, with English translation of Search Report, 9 pages.
Yamagishi et al., U.S. Appl. No. 15/769,189, filed Apr. 18, 2018, for "Curable Resin Film and First Protective Film Forming Sheet," (parent application).
European Office Action dated Jul. 17, 2023 in European Application No. 16862096.1, 5 pages.
"There's more than one way to measure powder particle size!", Metal Powder Report, MPR Publishing Services, Shrewsbury, GB, vol. 58, No. 11, Oct. 11, 2003 (Oct. 11, 2003), XP004471292, ISSN: 0026-0657, pp. 26-31.

* cited by examiner

METHOD OF FORMING FIRST PROTECTIVE FILM

This application is a divisional application of Ser. No. 15/769,189, filed Apr. 18, 2018, which is the U.S. national phase of International Application No. PCT/JP2016/082505 filed Nov. 2, 2016 which designated the U.S. and claims priority to Japanese Patent Application No. 2015-217111, filed on Nov. 4, 2015, the entire contents of each of which are hereby incorporated herein by reference.

TECHNICAL FIELD

The present invention relates to a curable resin film and a first protective film forming sheet provided with the curable resin film.

BACKGROUND ART

In the related art, in a case in which a multi-pin LSI package, which is used in MPU or a gate array, is mounted on a printed wiring board, a flip chip mounting method in which a semiconductor chip in which convex electrodes (bumps) made of eutectic solder, high-temperature solder, metal, or the like are formed in connection pad portions is used, and these bumps are made to face, brought into contact with, and melting/diffusion-joined to the corresponding terminal portions on a chip mounting substrate using a so-called face down method has been employed.

The semiconductor chip that is used in this mounting method is obtained by, for example, dividing a semiconductor wafer having bumps formed on a circuit surface by grinding a surface opposite to the circuit surface or dicing the semiconductor wafer. In the process of obtaining the above-described semiconductor chip, generally, for the purpose of protecting a circuit surface and a bump of the semiconductor wafer, a curable resin film is attached to a bump-formed surface, and this film is cured so as to form a protective film on the bump-formed surface. As such a curable resin film, those containing a thermosetting component that is cured by heating are widely used. As a protective film forming sheet including the above-described curable resin film, a protective film forming sheet formed by stacking a thermoplastic resin layer having a predetermined thermal elastic modulus on the film and further stacking a thermoplastic resin layer which is not plastic at 25° C. on the uppermost layer of the thermoplastic resin layer has been disclosed (for example, refer to Patent Document 1). According to Patent Document 1, this protective film forming sheet is excellent in terms of the bump filling property of the protective film, the wafer workability, the electric connection reliability after resin sealing, and the like.

CITATION LIST

Patent Literature

[Patent Document 1] Japanese Unexamined Patent Application, First Publication No. 2005-028734

SUMMARY OF INVENTION

Technical Problem

On the other hand, when manufacturing a semiconductor chip by using a protective film forming sheet provided with a curable resin film as described above, after a protective film is formed on a bump-formed surface of a semiconductor wafer by thermally curing the curable resin film, this protective film is greatly distorted in a concave shape at the position between the bumps in some cases (refer to FIG. 6). In FIG. 6, a protective film 101a formed on a surface 105a, which is a surface, on which a bump 151 is formed on a semiconductor wafer 105, by thermally curing a thermosetting resin film is greatly distorted concavely on a side of the surface 105a. Such a large distortion in a concave shape of the protective film 101a is considered to occur due to contraction or the like when the curable resin film is cured on the surface 105a of the semiconductor wafer 105.

In this way, if the large distortion in the concave shape occurs on the protective film 101a on the semiconductor wafer 105, for example, when performing inspection of the circuit surface in a manufacturing step of the semiconductor wafer, there is a possibility that deviation occurs in alignment between an inspection apparatus and the semiconductor wafer, so that it is difficult to perform accurate inspection. In addition, when the large distortion in the concave shape occurs on the protective film 101a, at the time of dicing the semiconductor wafer 105 in chip units using a dicing apparatus, there is a possibility that deviation occurs in alignment between a dicing saw provided in the dicing apparatus and the semiconductor wafer, so that it is difficult to perform accurate dicing. As a cause of the deviation of the alignment as described above, it is considered that the protective film 101a is largely distorted in the concave shape, and thus a lens action occurs in this concave portion, and the shape of the surface 105a which is a circuit surface of the semiconductor wafer 105, for example, the shape of a pattern 152 or the position thereof cannot be accurately detected.

Therefore, in the related art, in a case where the large distortion in the concave shape occurs on the protective film 101a on the semiconductor wafer 105, yield of the semiconductor chip is lowered or the reliability as a semiconductor package is deteriorated, which is a serious problem.

The present invention has been made in view of the above problems, and an object of the present invention is to provide a curable resin film and a first protective film forming sheet, which are capable of suppressing occurrence of large distortion in a concave shape on a first protective film when the first protective film is formed on a bump-formed surface of the semiconductor wafer.

Solution to Problem

In order to solve the above-mentioned problems, the inventors of the present invention have extensively studied experiments and studies. As a result, it has been found that after optimizing the weight-average molecular weight of the curable component contained in the curable resin film used for forming the first protective film, when a dimensional relationship between of the first protective film cured under predetermined conditions and the bump is appropriately defined, on a semiconductor wafer having a plurality of bumps of a predetermined dimensional shape and arrangement condition, the occurrence of the large distortion in the concave shape on the first protective film disposed between the bumps can be suppressed, and thereby the present invention has been completed.

That is, according to the present invention, there is provided a curable resin film for forming the first protective film on a surface having a plurality of bumps on the semiconductor wafer by being attached to the surface and being cured, in which the curable resin film contains an epoxy-based thermosetting component having a weight-average molecular weight of 200 to 4,000 as a curable component, a first protective film that protects the plurality of bumps is formed by attaching the curable resin film to a surface of the semiconductor wafer having the plurality of bumps with an average peak height h1 of 50 to 400 µm, an average diameter D of 60 to 500 µm in a plan view, and an average pitch P of 100 to 800 µm, heating the attached curable resin film at 100° C. to 200° C. for 0.5 to three hours, and curing the heated curable resin film, and when longitudinal sections of the first protective film and the semiconductor wafer having the plurality of bumps are observed by a scanning electron microscope, a ratio (h3/h1) of an average thickness h3 of the first protective film at a center position between the plurality of bumps to the average peak height h1 of the plurality of bumps, and a ratio (h2/h1) of an average thickness h2 of the first protective film at a position being in contact with the plurality of bumps to the average peak height h1 satisfy a relationship represented by the following Expression (1).

$$\{(h2/h1)-(h3/h1)\} \leq 0.1 \tag{1}$$

In addition, according to the present invention, there is provided a curable resin film for forming the first protective film on a surface having a plurality of bumps on the semiconductor wafer by being attached to the surface and being cured, in which the curable resin film contains an energy ray-curable component having a weight-average molecular weight of 200 to 4,000 as a curable component, a first protective film that protects the plurality of bumps is formed by attaching the curable resin film to a surface of the semiconductor wafer having the plurality of bumps with an average peak height h1 of 50 to 400 µm, an average diameter D of 60 to 500 µm in a plan view, and an average pitch P of 100 to 800 µm, irradiating the attached curable resin film with energy rays under a condition of illuminance of 50 to 500 mW/cm$^2$, and light intensity of 100 to 2,000 mJ/cm$^2$, and curing the irradiated curable resin film, and when longitudinal sections of the first protective film and the semiconductor wafer having the plurality of bumps are observed by a scanning electron microscope, a ratio (h3/h1) of an average thickness h3 of the first protective film at a center position between the plurality of bumps to the average peak height h1 of the plurality of bumps, and a ratio (h2/h1) of an average thickness h2 of the first protective film at a position being in contact with the plurality of bumps to the average peak height h1 satisfy a relationship represented by the following Expression (1).

$$\{(h2/h1)-(h3/h1)\} \leq 0.1 \tag{1}$$

In the above configuration, it is more preferable that the curable resin film of the present invention contains 5% to 80% by mass of filler having an average particle diameter of 5 to 1,000 nm.

In addition, according to the present invention, there is provided a first protective film forming sheet including the curable resin film having any configuration described above on one surface of a first supporting sheet.

Advantageous Effects of Invention

According to the present invention, the curable resin film and the first protective film forming sheet provided with the curable resin film, after optimizing the weight-average molecular weight of the curable component contained in the curable resin film used for forming the first protective film, when a dimensional relationship between of the first protective film cured under predetermined conditions and the bump is appropriately defined, on a semiconductor wafer having a plurality of bumps of a predetermined dimensional shape and arrangement condition. With this, it is possible to suppress the occurrence of the large distortion in the concave shape the first protective film disposed between the bumps. As a result, for example, the inspection in a step of manufacturing a semiconductor wafer and the alignment accuracy in a step of dicing the semiconductor wafer into a chip improve. Therefore, the inspection accuracy and the dicing accuracy in the manufacturing step improve, and a semiconductor package excellent in the reliability can be manufactured.

DESCRIPTION OF EMBODIMENTS

Figure 1A:
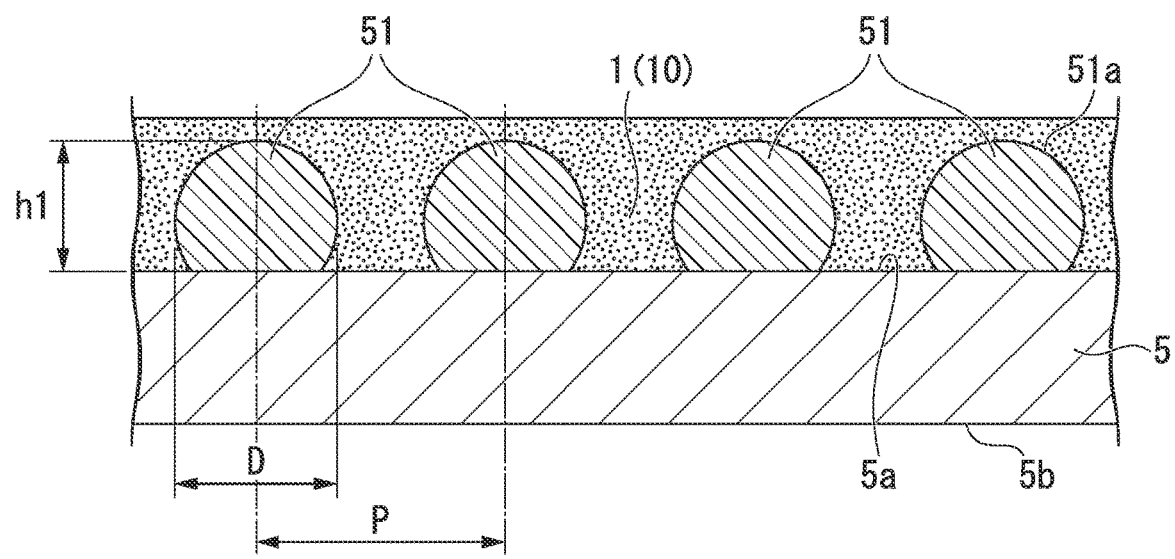
FIG. 1A is a sectional view schematically showing an example of procedure of forming a first protective film on a bump-formed surface of a semiconductor wafer by using a curable resin film according to the present invention, and is a diagram showing a state in which the curable resin film is attached to the bump-formed surface of the semiconductor wafer.
Figure 1B:
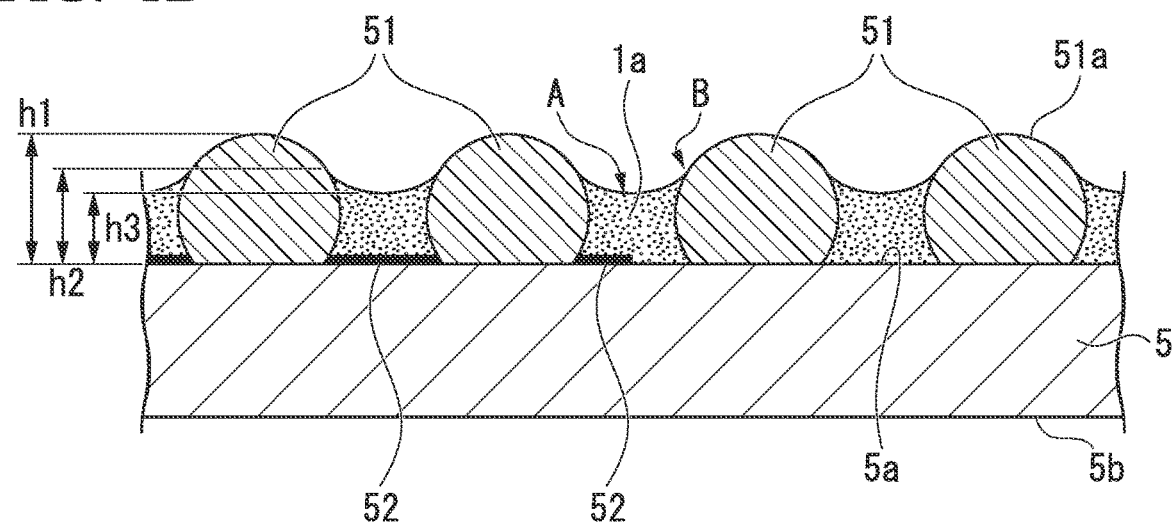
FIG. 1B is a sectional view schematically showing an example of procedure of forming a first protective film on the bump-formed surface of the semiconductor wafer by using the curable resin film according to the present invention, and is a diagram showing a state in which the first protective film is formed by thermally curing the curable resin film.
Figure 2:
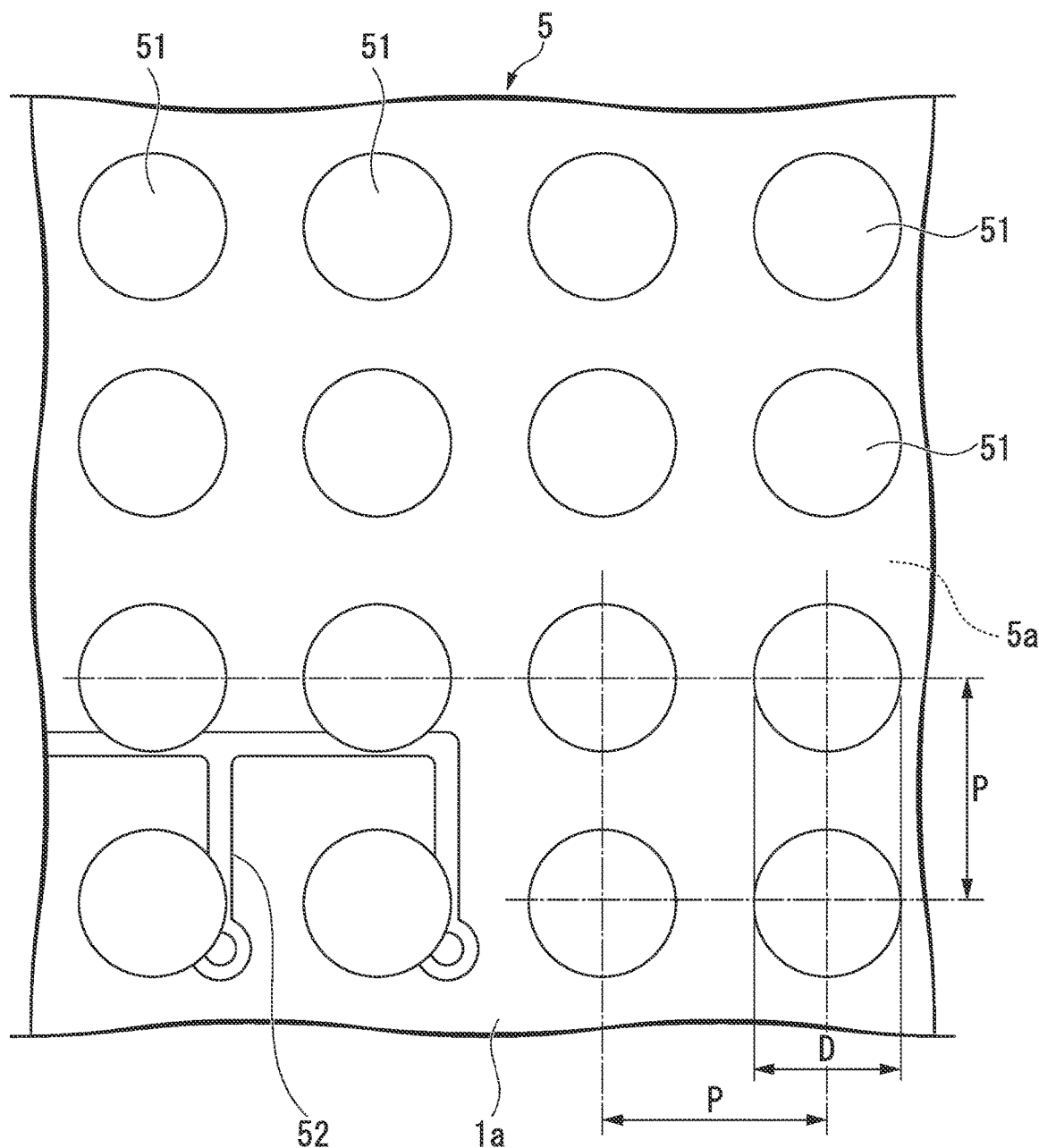
FIG. 2 is a plan view schematically showing an example of a state in which the first protective film is formed on the bump-formed surface of the semiconductor wafer by using the curable resin film according to the present invention.
Figure 3:
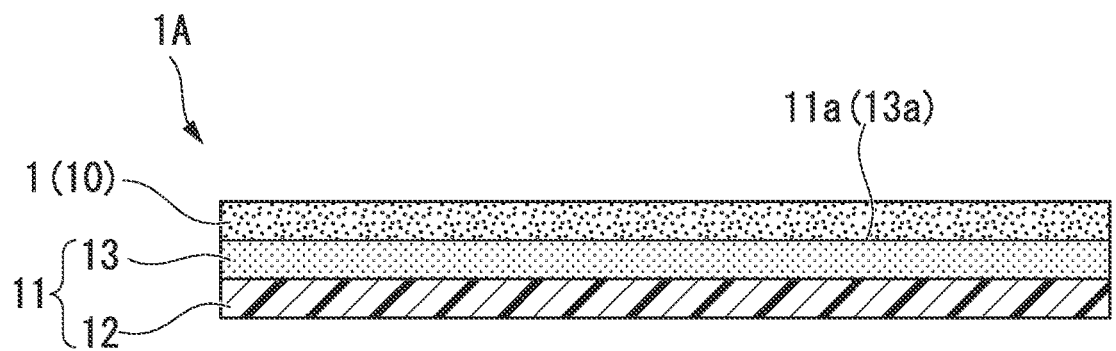
FIG. 3 is a sectional view schematically showing an example of a layer structure of the curable resin film and the first protective film forming sheet according to the present invention.
Figure 4:
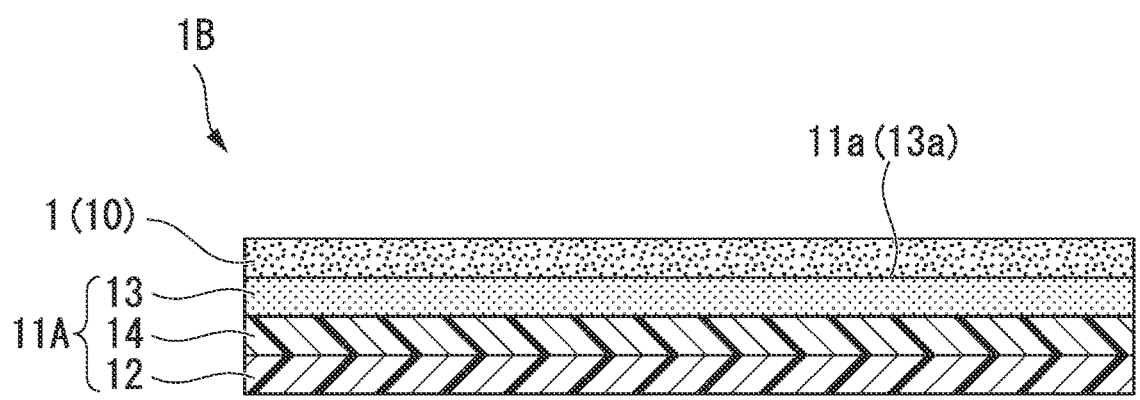
FIG. 4 is a sectional view schematically showing another example of a layer structure of the curable resin film and the first protective film forming sheet according to the present invention.
Figure 5:
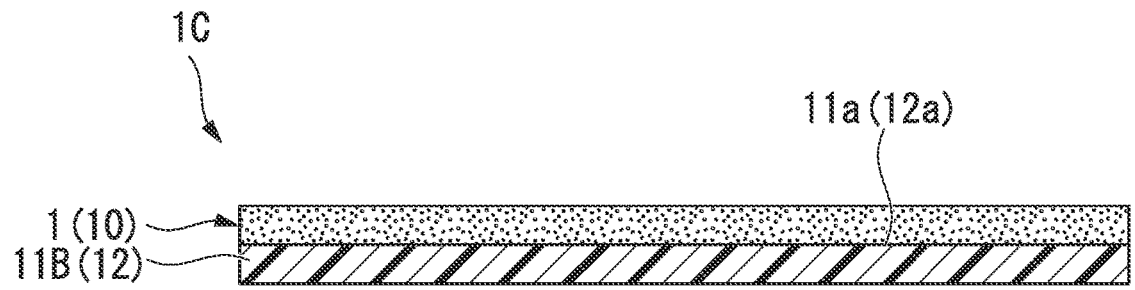
FIG. 5 is a sectional view schematically showing still another example of a layer structure of the curable resin film and the first protective film forming sheet according to the present invention.
Figure 6:
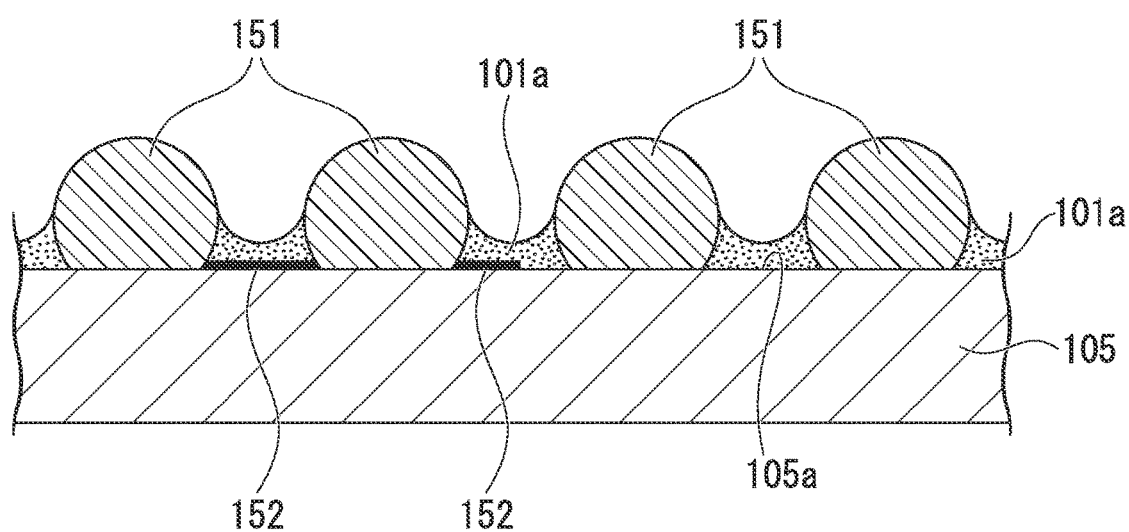
FIG. 6 is a diagram showing a state in which the protective film is formed on the bump-formed surface of the semiconductor wafer by using the curable resin film in the related art.

Hereinafter, embodiments of a curable resin film of the present invention and a first protective film forming sheet using the same will be described in detail with reference to the drawings of FIGS. 1 to 5 of the present invention and the drawing of FIG. 6 of the related art, as necessary. FIGS. 1A and 1B are sectional views schematically showing an example of procedure of forming the first protective film on the bump-formed surface of the semiconductor wafer by using the curable resin film according to the present invention, and FIG. 2 is a plan view of the semiconductor wafer shown in FIG. 1B. In addition, FIGS. 3 to 5 are sectional views schematically showing each example of the layer structure of the curable resin film and the first protective film forming sheet. Further, FIG. 6 is a diagram showing an example in which the first protective film is formed on the bump-formed surface of the semiconductor wafer by using the curable resin film in the related art. Note that, in the drawings used in the following description, for the sake of easy understanding of the features of the present invention, and for the sake of convenience, a portion serving as a main part is sometimes enlarged and the dimensional ratio and the like of each component may be different from the actual one. Further, in the present specification, the above-described "film" may be referred to as "layer" in some cases.

The curable resin film 1 according to the present invention as shown in FIGS. 3 to 5 are for forming a first protective film 1*a* that protects a plurality of bumps 51 on a semiconductor wafer 5 as shown in FIGS. 1A and 1B, and FIG. 2. That is, the curable resin film 1 of the present invention is used to form a first protective film 1*a* on the surface 5*a* by being attached to the surface 5*a* having the plurality of bumps 51 on the semiconductor wafer 5 as shown in FIG. 1A, and being cured as shown in FIG. 1B.

In addition, a first protective film forming sheet 1A according to the present invention is provided with the curable resin film 1 on one surface 11*a* of the first supporting sheet 11, as shown in FIG. 3. That is, before attaching the curable resin film 1 on the semiconductor wafer 5, the first protective film forming sheet 1A transports the curable resin film 1 as a product package, for example, or stably supports and protects the curable resin film 1 by the first supporting sheet 11 when transporting the curable resin film 1 in the process.

Hereinafter, configurations of the curable resin film 1 of the present invention and the first protective film forming sheet 1A are specifically described in order.

<<Curable Resin Film>>

As described above, the curable resin film of the present invention is a layer (film) for protecting the plurality of bumps 51 on the surface 5*a* of the semiconductor wafer 5, and the first protective film 1*a* is formed by heating or curing with energy ray irradiation.

<Curable Resin Film Containing Thermosetting Component>

The curable resin film 1 of the present invention is configured to contain an epoxy-based thermosetting component having a weight-average molecular weight of 200 to 4,000 as a curable component.

In addition, the curable resin film 1 of the present invention is used to form the first protective film by being attached to the semiconductor wafer 5 having the plurality of bumps 51 on the surface 5*a* as shown in FIGS. 1A and 1B.

The curable resin film 1 of the present invention forms the first protective film 1*a* that protects the plurality of bumps 51 and the surface 5*a* by attaching the curable resin film onto the semiconductor wafer 5 having the plurality of bumps 51 with an average peak height h1 of 50 to 400 μm, an average diameter D of 60 to 500 μm in a plan view, and an average pitch P of 100 to 800 μm, and heating the attached curable resin film at 100° C. to 200° C. for 0.5 to 3 hours, and curing the heated curable resin film, and when longitudinal sections of the first protective film 1*a* and the semiconductor wafer 5 are observed by a scanning electron microscope, a ratio (h3/h1) of an average thickness h3 of the first protective film 1*a* at a center position between the plurality of bumps 51 to an average peak height h1 of the plurality of bumps 51, and a ratio (h2/h1) of an average thickness h2 of the first protective film 1*a* at a position being in contact with the plurality of bumps 51 to the average peak height h1 satisfy a relationship represented by the following Expression (1).

$$\{(h2/h1)-(h3/h1)\} \le 0.1 \quad (1)$$

The "average thickness h3 of the first protective film 1*a* at a center position between the plurality of bumps 51" defined in the present invention substantially means a portion in which the thickness of the first protective film 1*a* in the vicinity of the center between the plurality of bumps 51 is substantially the thinnest.

Also, the "average pitch P" in "the plurality of bumps 51 having the plurality of bumps 51 with average pitch P of 100 to 800 μm" defined in the present invention means the average pitch between the center lines of each bump 51. Note that, the average peak height h1 of the plurality of bumps, average thickness h2 of the first protective film at the position being in contact with the plurality of bumps, the average thickness h3 of the first protective film at the center position between the plurality of bumps, the average pitch P, and the average diameter D can be measured by image analysis using a scanning electron microscope.

As described above, the curable resin film 1 of the present invention is used by being attached to the surface 5*a* having the bump 51 in the semiconductor wafer 5. Then, the curable resin film 1 after attachment has an increase in fluidity by heating, spreads between the plurality of bumps 51 so as to cover the bumps 51, is close contact with the surface (circuit surface) 5*a*, and embeds the bump 51 while covering the surface 51*a* of the bump 51, particularly, the vicinity of the surface 5*a* of the semiconductor wafer 5. The curable resin film 1 in such a state is thermally cured by being further heated so as to finally form the first protective film 1*a* and protects the bump 51 in a state of being in close contact with the surface 51*a* on the surface 5*a*. The semiconductor wafer 5 to which the curable resin film 1 is attached is detached and removed from a first supporting sheet (refer to the first supporting sheet 11 provided in the first protective film forming sheet 1A as shown in FIG. 3) after grinding the surface (the back surface 5*b*) on the side opposite to the surface 5*a* which is the circuit surface. Subsequently, embedding of the bumps 51 and formation of the first protective film 1*a* are performed by heating the curable resin film 1, and finally, the semiconductor wafer is incorporated into a semiconductor device (not shown) in a state where this first protective film 1*a* is provided.

The plurality of the bumps 51 are provided on surface 5*a* which is the circuit surface of the semiconductor wafer 5. The bump 51 has, for example, a shape of a sphere a part of which is cut out along a flat surface, and a flat surface corresponding to a portion exposed by cutting out the above-described part is in contact with the surface 5*a* of the semiconductor wafer 5.

The first protective film 1*a* is formed with the curable resin film 1 of the present invention, covers the surface 5*a* of the semiconductor wafer 5, and further covers the top surface and the surface 51*a* other than the vicinity thereof among the bump 51. In this way, the first protective film 1*a* is close contact with the top surface of the bumps 51 and the area other than the vicinity thereof among the surfaces 51*a* of the bumps 51, and is also close contact with the surface (circuit surface) 5*a* the semiconductor wafer 5 so as to embed the bump 51. In the examples as shown in FIGS. 1A and 1B, the bumps have substantially spherical shapes (shapes in which a part of the spheres are cut out by planes) as described above, but the shape of the bump that can be protected by the first protective film 1*a* formed from the curable resin film 1 according to the present invention is not limited thereto. Examples of preferred bumps include a bump having a shape obtained by stretching the bump having a substantially spherical shape as shown in FIGS. 1A and 1B, in a height direction (direction orthogonal to the surface 5a of the semiconductor wafer 5 in FIGS. 1A and 1B), that is, a shape of a spheroid which is substantially long spherical (a shape in which a portion including one end in the major axis direction of a spheroid which is long spherical is cut out by a plane), and a bump having a shape obtained by crushing the bump having a substantially spherical shape in a height direction, that is, a shape of a spheroid which is substantially oblate (a shape in which a portion including one end in the minor axis direction of a spheroid which is substantially oblate is cut out by a plane). The first protective film 1a formed by the curable resin film 1 according to the present invention can be applied to the bumps having any other shapes, and particularly, in a case where the shape of the bump is a spherical shape including a spherical shape or an elliptical shape as described above, the effect of protecting the surface of the semiconductor wafer and the bump is remarkably obtained.

In addition, as described above, the curable resin film 1 of the present invention employs a configuration in which after optimizing the weight-average molecular weight of the curable component contained in the curable resin film 1, when a dimensional relationship between of the first protective film 1a cured under predetermined conditions and the plurality of bumps 51 are appropriately defined, on the semiconductor wafer 5 having the plurality of bumps 51 of a predetermined dimensional shape and arrangement condition. With this, it is possible to suppress the occurrence of the large distortion in the concave shape the first protective film 1a formed and disposed between the plurality of bumps 51. With this, for example, it is possible to obtain an effect of improving the inspection in a step of manufacturing a semiconductor wafer and the alignment accuracy in a step of dicing the semiconductor wafer into a chip.

More specifically, regarding the curable resin film 1, as shown in FIG. 1B, in the first protective film 1a cured under the predetermined heating conditions, the ratio (h3/h1) of the average thickness h3 of the first protective film 1a at the center position A between the plurality of bumps 51 to the average peak height h1 of the plurality of bumps 51, and the ratio (h2/h1) of the average thickness h2 of the first protective film 1a at the position B being in contact with the plurality of bumps 51 satisfy the relationship represented by the following expression {|(h2/h1)−(h3/h1)|≤0.1}. That is, in the first protective film 1a formed by thermally curing the curable resin film 1, as represented by the above expression, the average thickness h2 at the position B being in contact with the plurality of bumps 51 and the average thickness h3 at the center position A between the plurality of bumps 51 are defined in a relationship in which the average thickness h2 is thicker and the difference between both is minimized. That is, according to one aspect of the present invention, examples thereof include a curable resin film and a first protective film forming sheet which have the properties satisfying the above relationship.

In addition, as shown in FIGS. 1A and 1B, and FIG. 2, the first protective film 1a formed of the curable resin film 1 according to the present invention is prevented from shrinking in the film during curing, and thus it is possible to effectively suppress the occurrence of the large distortion in a concave shape. For example, in FIG. 1B and FIG. 2, the large distortion does not occur in the first protective film 1a and fluoroscopic defects due to a lens effect or the like do not occur, so that a circuit pattern 52 on the surface 5 of the semiconductor wafer 5 can be clearly recognized. With this, it is possible to accurately detect the arrangement shape and the like of the circuit pattern 52 on the surface 5a of the semiconductor wafer 5, and therefore, for example, various inspections in the manufacturing step of the semiconductor wafer 5, and the alignment accuracy between the inspection apparatus, the manufacturing apparatus, the semiconductor wafer 5 in a step of dicing the semiconductor wafer 5 in a chip shape improve. Therefore, the inspection accuracy and the dicing accuracy improve, and a semiconductor package excellent in the reliability can be manufactured.

In the present invention, the curable component contained in the curable resin film 1 is configured to contain an epoxy-based thermosetting component having a weight-average molecular weight of 200 to 4,000. When the curable resin film 1 contains the epoxy-based thermosetting component within the above range, it is possible to minimize the occurrence of deformation due to thermal shrinkage or the like in the first protective film 1a after thermally curing. With this, it is possible to suppress the occurrence of the large distortion in the concave shape on the thermally-cured first protective film 1a. Meanwhile, in the present embodiment, unless particularly otherwise described, the weight-average molecular weight refers to a polystyrene-equivalent value measured using gel permeation chromatography (GPC).

Further, in the present invention, from the viewpoint of more remarkably obtaining the above action and effect, the weight-average molecular weight of the epoxy-based thermosetting component contained in the curable resin film 1 is more preferably 250 to 3,500, and particularly preferably 300 to 3,000.

Detailed components of the epoxy-based thermosetting component will be described later.

In the present invention, the curable resin film 1 may further contain a filler (D) which will be described in detail later. In this case, the average particle diameter and the amount of the filler (D) are not particularly limited, and for example, the filler having the average particle diameter of 5 to 1,000 nm is preferably contained in the curable resin film 1 by 5% to 80% by mass of the entire mass of the thermosetting resin composition forming the curable resin film 1. When the average particle diameter and the amount of the filler (D) contained in the curable resin film 1 are limited to the above-mentioned range, it is possible to obtain an effect in which the occurrence of the large distortion in a concave shape in the cured first protective film 1a as described above can be more remarkably suppressed. It is considered that the reason for this is that when a certain percentage of the filler (D) contained in the curable resin film 1 is limited to those having an average particle diameter in a predetermined range, shrinkage or the like which is likely to occur at the time of curing the curable resin film 1 can be effectively suppressed.

Note that, the average particle diameter of the filler (D) is more preferably 5 to 500 nm, and particularly preferably 10 to 300 nm, from the viewpoint that the above action and effect can be more remarkably obtained. Here, the above average particle diameter is obtained by measuring the outer diameter of one particle at several places and calculating the average value thereof.

In addition, the amount of the filler (D) in the curable resin film 1 is more preferably 7% to 60% by mass of the entire mass of the thermosetting resin composition forming the curable resin film 1 after limiting the average particle diameter to the above range.

Detailed components of the filler (D) will be described later.

The thickness of the first protective film 1a after curing is not particularly limited, and the entire average thickness may be set within the range of the dimensional relationship represented by the above Expression (1). On the other hand, when considering of the protection function of the surface 5a and the bump 51 of the semiconductor wafer 5, the average thickness h3 of the first protective film 1a at the center position A between the plurality of bumps 51 is preferably set to be about 10 to 400 μm, and the average thickness h2 of the first protective film 1a at the position B being in contact with the bump 51 is preferably set to be about 1 to 350 μm.

Here, FIG. 6 schematically shows a cross section in a state where the protective film 101a is formed on the surface 105a which is the bump-formed surface of the semiconductor wafer 105 through the method by using the conventional curable resin film. As shown in FIG. 6, in a case of forming the protective film 101a using the conventional curable resin film in which a dimensional relationship between the weight-average molecular weight of the curable component contained in the curable resin film, the protective film 101a cured under the predetermined conditions, and the bump 151 is not appropriately set, protective film 101a has a large distortion in a concave shape at a position between the bumps 151 due to the shrinkage or the like occurring at the time of curing the curable resin film.

As shown in FIG. 6, in a case where the large distortion in a concave shape occurs on the protective film 101a on the semiconductor wafer 105, a lens action occurs in the concave portion, and thereby it is difficult to accurately detect the shape on the surface 105a which is the circuit surface of the semiconductor wafer 105 in some cases. For this reason, for example, when performing inspection of the circuit surface in a manufacturing step of the semiconductor wafer, there is a possibility that deviation occurs in alignment between an inspection apparatus and the semiconductor wafer, so that it is difficult to perform accurate inspection. In addition, in the case where the large distortion in the concave shape occurs on the protective film 101a, at the time of dicing the semiconductor wafer 105 in chip units, there is a possibility that deviation occurs in alignment between a dicing saw provided in the dicing apparatus and the semiconductor wafer, so that it is difficult to perform accurate dicing. Therefore, in a case where the protective film 101a is formed on the semiconductor wafer 105 by using a method of using the conventional curable resin film, yield of the semiconductor chip to be obtained is lowered or the reliability as a semiconductor package is deteriorated, which is a serious problem.

In contrast, according to the curable resin film 1 of the present invention, as described above, the weight-average molecular weight of the curable component contained in the curable resin film used for forming the first protective film 1, and a dimensional relationship between the first protective film 1a cured under predetermined conditions and the plurality of bumps 51 on the semiconductor wafer 5 having the plurality of bumps 51 of a predetermined dimensional shape and arrangement condition are appropriately defined. With this, it is possible to suppress the occurrence of the large distortion in the concave shape the first protective film 1a disposed between the bumps 51. Accordingly, the alignment accuracy in the step of performing the inspection step and the dicing step of the manufacturing step improves, and thus the inspection accuracy and the dicing accuracy improve, thereby manufacturing a semiconductor package excellent in the reliability.

<Curable Resin Film Containing Energy Ray-Curable Component>

The curable component contained in the curable resin film 10 of the present invention is configured to contain an energy ray-curable component having a weight-average molecular weight of 200 to 4,000, with respect to the curable resin film 1 containing the thermosetting component as described above.

Similar to the curable resin film 1 containing the above-described thermosetting component, the curable resin film 10 of the present invention is used to form the first protective film by being attached to the semiconductor wafer 5 having the plurality of bumps 51 on the surface 5a as shown in FIGS. 1A and 1B.

The curable resin film 10 of the present invention forms the first protective film 1a that protects the plurality of bumps 51 and the surface 5a by attaching the curable resin film onto the semiconductor wafer 5 having the plurality of bumps 51 with an average peak height h1 of 50 to 400 μm, an average diameter D of 60 to 500 μm in a plan view, and an average pitch P of 100 to 800 μm, and irradiating the attached curable resin film with energy rays under conditions of illuminance of 50 to 500 mW/cm$^2$, and light intensity of 100 to 2,000 mJ/cm$^2$ and curing the irradiated curable resin film, and when longitudinal sections of the first protective film 1a and the semiconductor wafer 5 are observed by a scanning electron microscope, a ratio (h3/h1) of an average thickness h3 of the first protective film 1a at a center position between the plurality of bumps 51 to an average peak height h1 of the plurality of bumps 51, and a ratio (h2/h1) of an average thickness h2 of the first protective film 1a at a position being in contact with the plurality of bumps 51 to the average peak height h1 satisfy a relationship represented by the following Expression (1).

$$\{(h2/h1)-(h3/h1)\} \le 0.1 \tag{1}$$

That is, the curable resin film 10 of the present invention is common to the above-described curable resin film 1 from the viewpoint of a dimensional shape and an arrangement condition of the plurality of bumps 51 on the semiconductor wafer 5, and each condition of a dimensional relationship between the cured first protective film 1a and the plurality of bumps 51. On the other hand, the curable resin film 10 of the present invention is different from the above-described curable resin film 1 from the viewpoint that the curable resin film 10 contains an energy ray-curable component as a curable component, and is cured by being irradiated with energy rays under curing conditions with the illuminance of 50 to 500 mW/cm$^2$, and the light intensity of 100 to 2000 mJ/cm$^2$.

In the present invention, the curable component contained in the curable resin film 10 is configured to contain an energy ray-curable component having a weight-average molecular weight of 200 to 4,000. When the curable resin film 10 contains the energy ray-curable component within the above range, it is possible to minimize the occurrence of deformation due to thermal shrinkage or the like in the first protective film 1a after curing by energy ray irradiation. With this, it is possible to suppress the occurrence of the large distortion in the concave shape on the cured first protective film 1a.

Note that, in the present invention, "energy rays" refer to rays having energy quanta in electromagnetic waves or charged particle radiation, and examples thereof include ultraviolet rays, electron beams, and the like.

Ultraviolet rays can be radiated using, for example, a high-pressure mercury lamp, a fusion lamp, a xenon lamp, LED, or the like as an ultraviolet ray source. As the electron beams, electron beams generated using an electron beam accelerator or the like can be radiated.

In the present invention, "being energy ray-curable" refers to a property of being cured by being irradiated with energy rays, and "being non-energy ray-curable" refers to a property of not being cured by being irradiated with energy rays.

Further, in the present invention, from the viewpoint of more remarkably obtaining the above action and effect, the weight-average molecular weight of the energy ray-curable component contained in the curable resin film 10 is more preferably 200 to 4,000, and particularly preferably 300 to 4,000.

Detailed components of the energy ray-curable component will be described later.

<<First Protective Film Forming Sheet (Curable Resin Film)>>

Hereinafter, the configurations of curable resin films 1 and 10 having the above-described configuration, and the first protective film forming sheet 1A in which any one of the above curable resin films is provided on the first supporting sheet are further described in detail.

<First Supporting Sheet>

The first supporting sheet 11 provided with first protective film forming sheet 1A may be a sheet made of a single layer (monolayer) or a sheet made of a plurality of layers of two or more layers. In a case in which the first supporting sheet 11 is made of a plurality of layers, the constituent materials and the thicknesses of the plurality of layers may be identical to or different from one another, and the combination of the plurality of layers is not particularly limited as long as the effects of the present invention are not impaired.

Meanwhile, in the present embodiment, the sentence "component materials of a plurality of layers and the thickness may be identical to or different from one another" means that "all of the layers may be identical to one another, all of the layers may be different from one another, or only some of the layers may be identical to one another", which will be true not only for the first supporting sheet but also for other elements. Furthermore, the sentence "a plurality of layers is different from one another" means that "at least one of the constituent materials and the thicknesses of the respective layers are different from one another".

Examples of a preferred the first supporting sheet 11 include a structure formed by stacking a first pressure-sensitive adhesive layer on a first base material, a structure formed by stacking a first interlayer on the first base material and stacking the first pressure-sensitive adhesive layer on the first interlayer, and a structure formed of the first base material.

An example of the first protective film forming sheet according to the present invention will be described with reference to FIGS. 3 to 5 for each kind of such first supporting sheet.

FIG. 3 is a sectional view schematically showing an example of the first protective film forming sheet of the present invention. In the first protective film forming sheet 1A as shown in FIG. 3, the first supporting sheet 11 is formed by stacking the first pressure-sensitive adhesive layer 13 on the first base material 12. That is, the first protective film forming sheet 1A is configured to include the first pressure-sensitive adhesive layer 13 on the first base material 12, and the curable resin film 1 including the thermosetting component on the first pressure-sensitive adhesive layer 13. The first supporting sheet 11 is a stacked body of the first base material 12 and the first pressure-sensitive adhesive layer 13, in which the curable resin film 1 is provided on one surface 11a of the first supporting sheet 11, that is, on one surface 13a of the first pressure-sensitive adhesive layer 13.

In the first protective film forming sheet 1A, as described above, the curable resin film 1 is used to be attached to the bump-formed surface of the semiconductor wafer, and is obtained by appropriately regulating a dimensional relationship between of the first protective film 1a cured under predetermined conditions and the plurality of bumps 51, on a semiconductor wafer 5 having the plurality of bumps 51 of on the semiconductor wafer 5 having the plurality of bumps 51 having the weight-average molecular weight, a predetermined dimensional shape and arrangement condition of the curable component to be e contained.

FIG. 4 is a sectional view schematically showing another example of the first protective film forming sheet of the present invention. Meanwhile, in FIG. 4, the same constituent element as in FIG. 3 is given the same reference sign as in FIG. 3 and will not be described in detail, and the same is true for FIG. 5.

The first protective film forming sheet 1B as shown in FIG. 4 uses the first supporting sheet obtained by stacking the first interlayer on the first base material, and stacking the first pressure-sensitive adhesive layer on the first interlayer. That is, the first protective film forming sheet 1B is configured to include the first interlayer 14 on the first base material 12, the first pressure-sensitive adhesive layer 13 on the first interlayer 14, and the curable resin film 1 on the first pressure-sensitive adhesive layer 13. The first supporting sheet 11A is a stacked body obtained by stacking the first base material 12, the first interlayer 14, and the first pressure-sensitive adhesive layer 13 in this order, in which the curable resin film 1 is provided on one surface 11a of the first supporting sheet 11A, that is, on one surface 13a of the first pressure-sensitive adhesive layer 13.

In other words, the first protective film forming sheet 1B is further provided with the first interlayer 14 between the first base material 12 and the first pressure-sensitive adhesive layer 13 in the first protective film forming sheet 1A as shown in FIG. 3.

In the first protective film forming sheet 1B, as described above, the curable resin film 1 is used to be attached to the bump-formed surface of the semiconductor wafer, and is obtained by appropriately regulating a dimensional relationship between of the first protective film 1a cured under predetermined conditions and the plurality of bumps 51, on a semiconductor wafer 5 having the plurality of bumps 51 of on the semiconductor wafer 5 having the plurality of bumps 51 having the weight-average molecular weight, a predetermined dimensional shape and arrangement condition of the curable component to be e contained.

FIG. 5 is a sectional view schematically showing still another example of the first protective film forming sheet of the present invention.

In the first protective film forming sheet 1C as shown in FIG. 5, the first supporting sheet is formed of only the first base material. That is, the first protective film forming sheet 1C is configured to include curable resin film 1 on the first base material 12.

The first supporting sheet 11B is formed of only the first base material 12, the curable resin film 1 is provided in direct contact with on one surface 11a of the first supporting sheet 11B, that is, one surface 12a of the first base material 12.

In other words, the first protective film forming sheet 1C is formed by removing the first pressure-sensitive adhesive layer 13 in the first protective film forming sheet 1A as shown in FIG. 3.

In the first protective film forming sheet 1C, as described above, the curable resin film 1 is used to be attached to the bump-formed surface of the semiconductor wafer, and is obtained by appropriately regulating a dimensional relationship between of the first protective film 1a cured under predetermined conditions and the plurality of bumps 51, on a semiconductor wafer 5 having the plurality of bumps 51 of on the semiconductor wafer 5 having the plurality of bumps 51 having the weight-average molecular weight, a predetermined dimensional shape and arrangement condition of the curable component to be e contained.

Hereinafter, each configuration of the first supporting sheet will be described in detail.

[First Base Material]

The first base material provided with the first supporting sheet is a sheet-form or film-form base material, and examples of a constituent material thereof include the following various resins.

Examples of the resins forming the first base material include polyethylene such as low-density polyethylene (LDPE), linear low-density polyethylene (LLDPE), and high-density polyethylene (HDPE); polyolefin other than polyethylene such as polypropylene, polybutene, polybutadiene, polymethylpentene, and norbornene resins; ethylene-based copolymers (copolymers obtained using ethylene as monomers) such as ethylene-vinyl acetate copolymers, ethylene-(meth)acrylate copolymers, ethylene-(meth)acrylic acid ester copolymers, and ethylene-norbornene copolymers; vinyl chloride-based resins (resins obtained using vinyl chloride as monomers) such as polyvinyl chloride and vinyl chloride copolymers; polystyrene; polycycloolefin; polyesters such as polyethylene terephthalate, polyethylene naphthalate, polybutylene terephthalate, polyethylene isophthalate, polyethylene-2,6-naphthalene dicarboxylate, and wholly aromatic polyesters in which all constituent units have an aromatic cyclic group; copolymers of two or more polyester described above; poly(meth)acrylic acid esters; polyurethane; polyurethane acrylate; polyimide; polyamide; polycarbonate; fluororesin; polyacetal; modified polyphenylene oxides; polyphenylene sulfides; polysulfone; polyether ketones; and the like.

In addition, examples of the resins constituting the first base material also include polymer alloys such as mixtures of the polyester and other resin are also exemplary examples. The polymer alloys of the polyester and other resin are preferably polymer alloys in which the amount of the resin other than the polyester is relatively small.

In addition, examples of the resins constituting the first base material also include crosslinked resins in which one or more resins described as exemplary examples above are crosslinked with each other; modified resins such as ionomers for which one or more resins described as exemplary examples above are used; and the like.

Meanwhile, in the present embodiment, "(meth)acrylic acid" refers to both "acrylic acid" and "methacrylic acid". What has been described above is also true for terminologies similar to (meth)acrylic acid, for example, "(meth)acrylate" refers to both "acrylate" and "methacrylate", and "a (meth) acryloyl group" refers to both "an acryloyl group" and "a methacryloyl group".

The forming the first base material may be constituted of only one type or two or more types of the resins. In a case in which the first base material has two or more types of resins, the combination and ratio thereof can be arbitrarily selected.

The first base material may be a single layer (monolayer) or a plurality of two or more layers. In a case in which the first base material is a plurality of layers, the respective layers in the plurality of layers may be identical to or different from one another, and the combination of the plurality of layers is not particularly limited.

The thickness of the first base material is preferably 5 to 1,000 μm, more preferably 10 to 500 μm, still more preferably 15 to 300 μm, and particularly preferably 20 to 150 μm.

Here, "the thickness of the first base material" refers to the thickness of the entire first base material, and, for example, the thickness of the first base material made up of a plurality of layers refers to the total thickness of all of the layers constituting the first base material.

The first base material is preferably a first base material having a high accuracy in thickness, that is, a first base material in which the variation of the thickness is suppressed throughout the entire portion. Among the above-described constituent materials, examples of materials having a high accuracy in thickness that can be used to constitute the above-described first base material include polyethylene, polyolefin other than polyethylene, polyethylene terephthalate, ethylene-vinyl acetate copolymers, and the like.

The first base material may also contain, in addition to the main constituent material such as the resin, a variety of well-known additives such as a filler, a colorant, an antistatic agent, an antioxidant, an organic lubricant, a catalyst, and a softening agent (plasticizer).

The first base material may be transparent or opaque and may be colored depending on the purpose. In addition, other layers may be deposited on the first base material.

In addition, in a case in which the first pressure-sensitive adhesive layer described below or the curable resin layer is energy ray-curable, the first base material preferably transmits energy rays.

The first base material can be manufactured using a well-known method. For example, the first base material containing the resin can be manufactured by forming a resin composition containing the resin.

[First Pressure-Sensitive Adhesive Layer]

The first pressure-sensitive adhesive layer has a sheet form or a film form and contains a pressure-sensitive adhesive.

Examples of the pressure-sensitive adhesive include pressure-sensitive adhesive resins such as acrylic resins (pressure-sensitive adhesives made of a resin having a (meth) acryloyl group), urethane-based resins (pressure-sensitive adhesives made of a resin having a urethane bond), rubber-based resins (pressure-sensitive adhesives made of a resin having a rubber structure), silicone-based resins (pressure-sensitive adhesives made of a resin having a siloxane bond), epoxy-based resins (pressure-sensitive adhesives made of a resin having an epoxy group), polyvinyl ethers, and polycarbonate, and acrylic resins are preferred.

Meanwhile, in the present invention, "pressure-sensitive adhesive resins" refer to both resins having a pressure-sensitive adhesiveness and resins having an adhesiveness, and examples thereof include not only resins having an adhesiveness for themselves but also resins exhibiting a pressure-sensitive adhesiveness when jointly used with other components such as additives, resins exhibiting an adhesiveness due to the presence of a trigger such as heat or water, and the like.

The first pressure-sensitive adhesive layer may be a single layer (monolayer) or a plurality of two or more layers. In a case in which the first pressure-sensitive adhesive layer is a plurality of layers, the respective layers in the plurality of layers may be identical to or different from one another, and the combination of the plurality of layers is not particularly limited.

The thickness of the first pressure-sensitive adhesive layer is preferably 1 to 1,000 μm, more preferably 5 to 500 μm, and particularly preferably 10 to 100 μm.

Here, "the thickness of the first pressure-sensitive adhesive layer" refers to the thickness of the entire first pressure-sensitive adhesive layer, and, for example, the thickness of the first pressure-sensitive adhesive layer made up of a plurality of layers refers to the total thickness of all of the layers constituting the first pressure-sensitive adhesive layer.

The first pressure-sensitive adhesive layer may be a first pressure-sensitive adhesive layer formed using an energy ray-curable pressure-sensitive adhesive or a first pressure-sensitive adhesive layer formed using a non-energy ray-curable pressure-sensitive adhesive. For the first pressure-sensitive adhesive layer formed using an energy ray-curable pressure-sensitive adhesive, it is possible to easily adjust the properties before curing and after curing.

{{First Pressure-Sensitive Adhesive Composition}}

The first pressure-sensitive adhesive layer can be formed using a first pressure-sensitive adhesive composition containing a pressure-sensitive adhesive. For example, the first pressure-sensitive adhesive layer can be formed at an intended portion by applying the first pressure-sensitive adhesive composition to a target surface on which the first pressure-sensitive adhesive layer is to be formed and drying the first pressure-sensitive adhesive composition as necessary. A more specific method for forming the first pressure-sensitive adhesive layer will be described below in detail together with methods for forming other layers. The ratio between the amounts of components, which do not gasify at normal temperature, in the first pressure-sensitive adhesive composition is, generally, identical to the ratio between the amounts of the above-described components in the first pressure-sensitive adhesive layer. Meanwhile, in the present embodiment, "normal temperature" refers to a temperature that is not particularly cooled or heated, that is, a temperature in an ordinary state, and examples thereof include a temperature of 15° C. to 25° C. and the like.

The first pressure-sensitive adhesive composition may be applied using a well-known method, and examples thereof include methods in which a variety of coaters such as an air knife coater, a blade coater, a bar coater, a gravure coater, a roll coater, a roll knife coater, a curtain coater, a die coater, a knife coater, a screen coater, a Mayer bar coater, and a kiss coater are used.

The drying conditions of the first pressure-sensitive adhesive composition are not particularly limited; however, in a case in which the first pressure-sensitive adhesive composition contains a solvent described below, the first pressure-sensitive adhesive composition is preferably heated and dried, and, in this case, the first pressure-sensitive adhesive composition is preferably dried under conditions of, for example, 70° C. to 130° C. and 10 seconds to 5 minutes.

In a case in which the first pressure-sensitive adhesive layer is energy ray-curable, examples of the first pressure-sensitive adhesive composition containing an energy ray-curable pressure-sensitive adhesive, that is, an energy ray-curable first pressure-sensitive adhesive composition include a first pressure-sensitive adhesive composition (I-1) containing a non-energy ray-curable pressure-sensitive adhesive resin (I-1a) (hereinafter, in some cases, abbreviated as "the pressure-sensitive adhesive resin (I-1a)") and an energy ray-curable compound; a first pressure-sensitive adhesive composition (I-2) containing an energy ray-curable pressure-sensitive adhesive resin (I-2a) in which an unsaturated group is introduced into a side chain of the non-energy ray-curable pressure-sensitive adhesive resin (I-1a) (hereinafter, in some cases, abbreviated as "the pressure-sensitive adhesive resin (I-2a)"); a first pressure-sensitive adhesive composition (I-3) containing the pressure-sensitive adhesive resin (I-2a) and an energy ray-curable low-molecular-weight compound; and the like.

{First Pressure-Sensitive Adhesive Composition (I-1)}

As described above, the first pressure-sensitive adhesive composition (I-1) contains the non-energy ray-curable pressure-sensitive adhesive resin (I-1a) and an energy ray-curable compound.

(Pressure-Sensitive Adhesive Resin (I-1a))

The pressure-sensitive adhesive resin (I-1a) is preferably an acrylic resin. Examples of the acrylic resin include acrylic polymers having at least a constituent unit derived from an alkyl (meth)acrylate.

The acrylic resin may have only one type or two or more types of constituent units, and in a case of two or more types, the combination and ratio thereof can be arbitrarily selected.

Examples of the alkyl (meth)acrylate include alkyl (meth)acrylates in which the number of carbon atoms in an alkyl group constituting the alkyl ester is 1 to 20, and the alkyl group is preferably a linear alkyl group or a branched alkyl group.

More specific examples of the alkyl (meth)acrylate include methyl (meth)acrylate, ethyl (meth)acrylate, n-propyl (meth)acrylate, isopropyl (meth)acrylate, n-butyl (meth)acrylate, isobutyl (meth)acrylate, sec-butyl (meth)acrylate, tert-butyl (meth)acrylate, pentyl (meth)acrylate, hexyl (meth)acrylate, heptyl (meth)acrylate, 2-ethylhexyl (meth)acrylate, isooctyl (meth)acrylate, n-octyl (meth)acrylate, n-nonyl (meth)acrylate, isononyl (meth)acrylate, decyl (meth)acrylate, undecyl (meth)acrylate, dodecyl (meth)acrylate (lauryl (meth)acrylate), tridecyl (meth)acrylate, tetradecyl (meth)acrylate (myristyl (meth)acrylate), pentadecyl (meth)acrylate, hexadecyl (meth)acrylate (palmityl (meth)acrylate), heptadecyl (meth)acrylate, octadecyl (meth)acrylate (stearyl (meth)acrylate), nonadecyl (meth)acrylate, (meth)acrylate, and the like.

The acrylic polymer preferably has a constituent unit derived from an alkyl (meth)acrylate in which the number of carbon atoms in the alkyl group is four or more from the viewpoint that the pressure-sensitive adhesive force of the first pressure-sensitive layer improves. In addition, the pressure-sensitive adhesive force of the first pressure-sensitive adhesive layer further improves, the number of carbon atoms in the alkyl group is preferably 4 to 12 and more preferably 4 to 8 from the viewpoint that the pressure-sensitive adhesive force of the first pressure-sensitive adhesive layer further improves. In addition, the alkyl (meth)acrylate in which the number of carbon atoms in the alkyl group is four or more is preferably alkyl acrylate.

The acrylic polymer preferably further has, in addition to the constituent unit derived from the alkyl (meth)acrylate, a constituent unit derived from a functional group-containing monomer.

Examples of the functional group-containing monomer include monomers in which the functional group reacts with a crosslinking agent described below and thus serves as a starting point of crosslinking or the functional group reacts with an unsaturated group in an unsaturated group-containing compound and thus enables the introduction of the unsaturated group into a side chain of the acrylic polymer.

Examples of the functional group in the functional group-containing monomer include a hydroxyl group, a carboxy group, an amino group, an epoxy group, and the like.

That is, examples of the functional group-containing monomer include hydroxyl group-containing monomers, carboxy group-containing monomers, amino group-containing monomers, epoxy group-containing monomers, and the like.

Examples of the hydroxyl group-containing monomers include hydroxyalkyl (meth)acrylates such as hydroxymethyl (meth)acrylate, 2-hydroxyethyl (meth)acrylate, 2-hydroxypropyl (meth)acrylate, 3-hydroxypropyl (meth)acrylate, 2-hydroxybutyl (meth)acrylate, 3-hydroxybutyl (meth) acrylate, and 4-hydroxybutyl (meth)acrylate; non-(meth) acrylic unsaturated alcohols such as vinyl alcohol and allyl alcohol (unsaturated alcohols not having a (meth)acryloyl skeleton); and the like.

Examples of the carboxy group-containing monomers include ethylenic unsaturated monocarboxylic acids such as (meth)acrylic acid and crotonic acid (monocarboxylic acids having an ethylenic unsaturated bond); ethylenic unsaturated dicarboxylic acids such as fumaric acid, itaconic acid, maleic acid, and citraconic acid (dicarboxylic acids having an ethylenic unsaturated bond); anhydrides of the ethylenic unsaturated dicarboxylic acid; carboxyalkyl (meth)acrylates such as 2-carboxyethyl methacrylate; and the like.

The functional group-containing monomer is preferably the hydroxyl group-containing monomer or the carboxy group-containing monomer and more preferably the hydroxyl group-containing monomer.

The acrylic polymer may be constituted of only one type or two or more types of the functional group-containing monomers. In a case in which the acrylic polymer is constituted of two or more types of the functional group-containing monomers, the combination and ratio thereof can be arbitrarily selected.

In the acrylic polymer, the amount of the constituent unit derived from the functional group-containing monomer is preferably 1% to 35% by mass, more preferably 3% to 32% by mass, and particularly preferably 5% to 30% by mass of the mass of the constituent units.

The acrylic polymer may further have, in addition to the constituent unit derived from the alkyl (meth)acrylate and the constituent unit derived from the functional group-containing monomer, a constituent unit derived from a different monomer.

The different monomer is not particularly limited as long as the monomer can be copolymerized with the alkyl (meth) acrylate or the like.

Examples of the different monomer include styrene, α-methylstyrene, vinyl toluene, vinyl formate, vinyl acetate, acrylonitrile, acrylamide, and the like.

The different monomer constituting the acrylic polymer may be constituted of only one type or two or more types of the functional group-containing monomers. In a case in which the different monomer constituting the acrylic polymer is constituted of two or more types of the functional group-containing monomers, the combination and ratio thereof can be arbitrarily selected.

The acrylic polymer can be used as the non-energy ray-curable pressure-sensitive adhesive resin (I-1a).

Meanwhile, a substance obtained by causing an unsaturated group-containing compound having an energy ray-polymerizable unsaturated group (energy ray-polymerizable group) to react with the functional group in the acrylic polymer can be used as the energy ray-curable pressure-sensitive adhesive resin (I-2a).

Meanwhile, in the present invention, "being energy ray-polymerizable" refers to a property of being polymerized by being irradiated with energy rays.

The first pressure-sensitive adhesive composition (I-1) may contain only one type or two or more types of the pressure-sensitive adhesive resin (I-1a). In a case in which the first pressure-sensitive adhesive composition (I-1) contains two or more types of the pressure-sensitive adhesive resins (I-1a), the combination and ratio thereof can be arbitrarily selected.

In the first pressure-sensitive adhesive composition (I-1), the amount of the pressure-sensitive adhesive resin (I-1a) is preferably 5% to 99% by mass, more preferably 10% to 95% by mass, and particularly preferably 15% to 90% by mass of the total mass of the first pressure-sensitive adhesive composition (I-1).

(Energy Ray-Curable Compounds)

Examples of the energy ray-curable compound contained in the first pressure-sensitive adhesive composition (I-1) include monomers or oligomers which have an energy ray-polymerizable unsaturated group and can be cured by being irradiated with energy rays.

Among the energy ray-curable compounds, examples of monomers include polyhydric (meth)acrylates such as trimethylol propane tri(meth)acrylate, pentaerythritol (meth) acrylate, pentaerythritol tetra(meth)acrylate, dipentaerythritol hexa(meth)acrylate, 1,4-butylene glycol di(meth) acrylate, and 1,6-hexanediol (meth)acrylate; urethane (meth)acrylate; polyether (meth)acrylate; polyether (meth) acrylate; epoxy (meth)acrylate; and the like.

Among the energy ray-curable compounds, examples of oligomers include oligomers obtained by polymerizing the monomers described as exemplary examples above.

The energy ray-curable compound is preferably urethane (meth)acrylate or a urethane (meth)acrylate oligomer since the molecular weight is relatively great and the storage elastic modulus of the first pressure-sensitive adhesive layer is not easily decreased.

The first pressure-sensitive adhesive composition (I-1) may contain only one type or two or more types of the energy ray-curable compounds. In a case in which the first pressure-sensitive adhesive composition (I-1) contains two or more types of the energy ray-curable compounds, the combination and ratio thereof can be arbitrarily selected.

In the first pressure-sensitive adhesive composition (I-1), the amount of the energy ray-curable compound is preferably 1% to 95% by mass, more preferably 5% to 90% by mass, and particularly preferably 10% to 85% by mass of the entire mass of the first pressure-sensitive adhesive composition (I-1).

(Crosslinking Agent)

In a case in which the acrylic polymer further having, in addition to the constituent unit derived from the alkyl (meth)acrylate, the constituent unit derived from the functional group-containing monomer as the pressure-sensitive adhesive resin (I-1a), the first pressure-sensitive adhesive composition (I-1) preferably further contains a crosslinking agent.

The crosslinking agent is, for example, a substance that reacts with the functional group and thus crosslinks the pressure-sensitive adhesive resins (I-1a).

Examples of the crosslinking agent include isocyanate-based crosslinking agents (crosslinking agents having an isocyanate group) such as tolylene diisocyanate, hexamethylene diisocyanate, xylylene diisocyanate, and adduct bodies of the above-described diisocyanate; epoxy-based crosslinking agents (crosslinking agents having a glycidyl group) such as ethylene glycol glycidyl ether; aziridine-based crosslinking agents (crosslinking agents having an aziridinyl group) such as hexa[1-(2-methyl)-aziridinyl]triphosphatriazine; metal chelate-based crosslinking agents (crosslinking agents having a metal chelate structure) such as aluminum chelates; isocyanurate-based crosslinking agents (crosslinking agents having an isocyanuric acid skeleton); and the like.

The crosslinking agent is preferably the isocyanate-based crosslinking agent since the isocyanate-based crosslinking agent improves the cohesive force of the pressure-sensitive adhesive so as to improve the pressure-sensitive adhesive force of the first pressure-sensitive adhesive layer, is easily procurable, and the like.

The first pressure-sensitive adhesive composition (I-1) may contain only one type or two or more types of the crosslinking agents. In a case in which the first pressure-sensitive adhesive composition (I-1) contains two or more types of the crosslinking agents, the combination and ratio thereof can be arbitrarily selected.

In the first pressure-sensitive adhesive composition (I-1), the amount of the crosslinking agent is preferably 0.01 to 50 parts by mass, more preferably 0.1 to 20 parts by mass, and particularly preferably 1 to 10 parts by mass of the amount (100 parts by mass) of the pressure-sensitive adhesive resin (I-1a).

(Photopolymerization Initiator)

The first pressure-sensitive adhesive composition (I-1) may also further contain a photopolymerization initiator. The first pressure-sensitive adhesive composition (I-1) containing the photopolymerization initiator sufficiently proceeds with a curing reaction even in a case of being irradiated with energy rays having a relatively low energy such as ultraviolet rays.

Examples of the photopolymerization initiator include benzoin compounds such as benzoin, benzoin methyl ether, benzoin ethyl ether, benzoin isopropyl ether, benzoin isobutyl ether, benzoin benzoate, methyl benzoin benzoate, and benzoin dimethyl ketal; acetophenone compounds such as 2-hydroxy-2-methyl-1-phenyl-propane-1-one, and 2,2-dimethoxy-1,2-diphenylethane-1-one; acylphosphine oxide compounds such as bis(2,4,6-trimethylbenzoyl)phenylphosphine oxide; sulfide compounds such as benzylphenyl sulfide and tetramethylthiuram monosulfide; α-ketol compounds such as 1-hydroxycyclohexyl phenyl ketone; azo compounds such as azobisisobutyronitrile; titanocene compounds such as titanocene; thioxanthone compounds such as thioxanthone; peroxide compounds; diketone compounds such as diacetyl; dibenzyl, and the like.

In addition, as the photopolymerization initiator, for example, a quinone compound such as 1-chloroanthraquinone; a photosensitizer such as amine; or the like can also be used.

The first pressure-sensitive adhesive composition (I-1) may contain only one type or two or more types of the photopolymerization initiators. In a case in which the first pressure-sensitive adhesive composition (I-1) contains two or more types of the photopolymerization initiators, the combination and ratio thereof can be arbitrarily selected.

In the first pressure-sensitive adhesive composition (I-1), the amount of the photopolymerization initiator is preferably 0.01 to 20 parts by mass, more preferably 0.03 to 10 parts by mass, and particularly preferably 0.05 to 5 parts by mass of the amount (100 parts by mass) of the energy ray-curable compound.

(Other Additives)

The first pressure-sensitive adhesive composition (I-1) may also contain other additives which do not correspond to any of the above-described components as long as the effects of the present invention are not impaired.

Examples of the other additives include a variety of well-known additives such as an antistatic agent, an antioxidant, a softening agent (plasticizer), a filler (filler), an antirust agent, a colorant (a pigment or a dye), a sensitizer, a tackifier, a reaction retardant, and a crosslinking accelerator (catalyst).

Meanwhile, the reaction retardant is a substance that suppresses the progress of an unintended crosslinking reaction in the first pressure-sensitive adhesive composition (I-1) under storage due to, for example, the action of the catalyst mixed into the first pressure-sensitive adhesive composition (I-1). Examples of the reaction retardant include reaction retardants that form a chelate complex due to a chelate with respect to the catalyst, and more specific examples thereof include substances having two or more carbonyl groups (—C(=O)—) in one molecule.

The first pressure-sensitive adhesive composition (I-1) may contain only one type or two or more types of other additives. In a case in which the first pressure-sensitive adhesive composition (I-1) contains two or more types of other additives, the combination and ratio thereof can be arbitrarily selected.

In the first pressure-sensitive adhesive composition (I-1), the amount of the other additives is not particularly limited and may be appropriately selected depending on the type of the additives.

(Solvent)

The first pressure-sensitive adhesive composition (I-1) may also contain a solvent. When the first pressure-sensitive adhesive composition (I-1) contains a solvent, the coating aptitude to a coating target surface improves.

The solvent is preferably an organic solvent, and examples of the organic solvent include ketones such as methyl ethyl ketone and acetone; esters (carboxylic acid esters) such as ethyl acetate; ethers such as tetrahydrofuran and dioxane; aliphatic hydrocarbons such as cyclohexane and n-hexane; aromatic hydrocarbons such as toluene and xylene; alcohols such as 1-propanol and 2-propanol; and the like.

As the solvent, a solvent used during the manufacturing of the pressure-sensitive adhesive resin (I-1a) may be used in the first pressure-sensitive adhesive composition (I-1) without being removed from the pressure-sensitive adhesive resin (I-1a). Alternatively, as the solvent, a solvent of the same type as or a different type from the solvent used during the manufacturing of the pressure-sensitive adhesive resin (I-1a) may be separately added during the manufacturing of the first pressure-sensitive adhesive composition (I-1).

The first pressure-sensitive adhesive composition (I-1) may contain only one type or two or more types of the solvents. In a case in which the first pressure-sensitive adhesive composition (I-1) contains two or more types of the solvents, the combination and ratio thereof can be arbitrarily selected.

In the first pressure-sensitive adhesive composition (I-1), the amount of the solvent is not particularly limited and may be appropriately adjusted.

{First Pressure-Sensitive Adhesive Composition (I-2)}

As described above, the first pressure-sensitive adhesive composition (I-2) contains an energy ray-curable pressure-sensitive adhesive resin (I-2a) in which an unsaturated group is introduced into a side chain of the non-energy ray-curable pressure-sensitive adhesive resin (I-1a).

(Pressure-Sensitive Adhesive Resin (I-2a))

The pressure-sensitive adhesive resin (I-2a) can be obtained by, for example, causing an unsaturated group-containing compound having an energy ray-polymerizable unsaturated group to react with the functional group in the pressure-sensitive adhesive resin (I-1a).

The unsaturated group-containing compound is a compound further having, in addition to the energy ray-polymerizable unsaturated group, a group that can be bonded with the pressure-sensitive adhesive resin (I-1a) by reacting with the functional group in the pressure-sensitive adhesive resin (I-1a).

Examples of the energy ray-polymerizable unsaturated group include a (meth)acryloyl group, a vinyl group (ethenyl group), an allyl group (2-propenyl group), and the like, and a (meth)acryloyl group is preferred.

Examples of the group that can be bonded with the functional group in the pressure-sensitive adhesive resin (I-1a) include isocyanate groups and glycidyl groups that can be bonded with a hydroxyl group or an amino group, hydroxyl groups and amino groups that can be bonded with a carboxy group or an epoxy group, and the like.

Examples of the unsaturated group-containing compound include (meth)acryloyloxyethyl isocyanate, (meth)acryloyl isocyanate, glycidyl (meth)acrylate, and the like.

The first pressure-sensitive adhesive composition (I-2) may contain only one type or two or more types of the pressure-sensitive adhesive resin (I-2a). In a case in which the first pressure-sensitive adhesive composition (I-2) contains two or more types of the pressure-sensitive adhesive resins (I-2a), the combination and ratio thereof can be arbitrarily selected.

In the first pressure-sensitive adhesive composition (I-2), the amount of the pressure-sensitive adhesive resin (I-2a) is preferably 5% to 99% by mass, more preferably 10% to 95% by mass, and particularly preferably 10% to 90% by mass of the total mass of the first pressure-sensitive adhesive composition (I-2).

(Crosslinking Agent)

In a case in which, as the pressure-sensitive adhesive resin (I-2a), for example, the acrylic polymer having the constituent unit derived from the functional group-containing monomer, which is the same as that in the pressure-sensitive adhesive resin (I-1a) is used, the first pressure-sensitive adhesive composition (I-2) may further contain a crosslinking agent.

Examples of the crosslinking agent in the first pressure-sensitive adhesive composition (I-2) include the same crosslinking agents as those in the first pressure-sensitive adhesive composition (I-1).

The first pressure-sensitive adhesive composition (I-2) may contain only one type or two or more types of the crosslinking agents. In a case in which the first pressure-sensitive adhesive composition (I-2) contains two or more types of the crosslinking agents, the combination and ratio thereof can be arbitrarily selected.

In the first pressure-sensitive adhesive composition (I-2), the amount of the crosslinking agent is preferably 0.01 to 50 parts by mass, more preferably 0.1 to 20 parts by mass, and particularly preferably 1 to 10 parts by mass of the amount (100 parts by mass) of the pressure-sensitive adhesive resin (I-2a).

(Photopolymerization Initiator)

The first pressure-sensitive adhesive composition (I-2) may also further contain a photopolymerization initiator. The first pressure-sensitive adhesive composition (I-2) containing the photopolymerization initiator sufficiently proceeds with a curing reaction even in a case of being irradiated with energy rays having a relatively low energy such as ultraviolet rays.

Examples of the photopolymerization initiator in the first pressure-sensitive adhesive composition (I-2) include the same photopolymerization initiators as those in the first pressure-sensitive adhesive composition (I-1).

The first pressure-sensitive adhesive composition (I-2) may contain only one type or two or more types of the photopolymerization initiators. In a case in which the first pressure-sensitive adhesive composition (I-2) contains two or more types of the photopolymerization initiators, the combination and ratio thereof can be arbitrarily selected.

In the first pressure-sensitive adhesive composition (I-2), the amount of the photopolymerization initiator is preferably 0.01 to 20 parts by mass, more preferably 0.03 to 10 parts by mass, and particularly preferably 0.05 to 5 parts by mass of the amount (100 parts by mass) of the pressure-sensitive adhesive resin (I-2a).

(Other Additives)

The first pressure-sensitive adhesive composition (I-2) may also contain other additives which do not correspond to any of the above-described components as long as the effects of the present invention are not impaired.

Examples of the other additives in the first pressure-sensitive adhesive composition (I-2) include the same other additives as those in the first pressure-sensitive adhesive composition (I-1).

The first pressure-sensitive adhesive composition (I-2) may contain only one type or two or more types of other additives. In a case in which the first pressure-sensitive adhesive composition (I-2) contains two or more types of other additives, the combination and ratio thereof can be arbitrarily selected.

In the first pressure-sensitive adhesive composition (I-2), the amount of the other additives is not particularly limited and may be appropriately selected depending on the type of the additives.

(Solvent)

The first pressure-sensitive adhesive composition (I-2) may also contain a solvent for the same purpose as in the case of the first pressure-sensitive adhesive composition (I-1).

Examples of the solvent in the first pressure-sensitive adhesive composition (I-2) include the same solvents as those in the first pressure-sensitive adhesive composition (I-1).

The first pressure-sensitive adhesive composition (I-2) may contain only one type or two or more types of the solvents. In a case in which the first pressure-sensitive adhesive composition (I-2) contains two or more types of the solvents, the combination and ratio thereof can be arbitrarily selected.

In the first pressure-sensitive adhesive composition (I-2), the amount of the solvent is not particularly limited and may be appropriately adjusted.

{First Pressure-Sensitive Adhesive Composition (I-3)}

As described above, the first pressure-sensitive adhesive composition (I-3) contains the pressure-sensitive adhesive resin (I-2a) and an energy ray-curable low-molecular-weight compound.

In the first pressure-sensitive adhesive composition (I-3), the amount of the pressure-sensitive adhesive resin (I-2a) is preferably 5% to 99% by mass, more preferably 10% to 95% by mass, and particularly preferably 15% to 90% by mass of the total mass of the first pressure-sensitive adhesive composition (I-3).

(Energy Ray-Curable Low-Molecular-Weight Compound)

Examples of the energy ray-curable low-molecular-weight compound contained in the first pressure-sensitive adhesive composition (I-3) include monomers or oligomers which have an energy ray-polymerizable unsaturated group and can be cured by being irradiated with energy rays and include the same energy ray-curable compounds as that in the first pressure-sensitive adhesive composition (I-1).

The first pressure-sensitive adhesive composition (I-3) may contain only one type or two or more types of the energy ray-curable low-molecular-weight compounds. In a case in which the first pressure-sensitive adhesive composition (I-3) contains two or more types of the energy ray-curable low-molecular-weight compounds, the combination and ratio thereof can be arbitrarily selected.

In the first pressure-sensitive adhesive composition (I-3), the amount of the energy ray-curable low-molecular-weight compound is preferably 0.01 to 300 parts by mass, more preferably 0.03 to 200 parts by mass, and particularly preferably 0.05 to 100 parts by mass of the amount (100 parts by mass) of the pressure-sensitive adhesive resin (I-2a).

(Photopolymerization Initiator)

The first pressure-sensitive adhesive composition (I-3) may also further contain a photopolymerization initiator. The first pressure-sensitive adhesive composition (I-3) containing the photopolymerization initiator sufficiently proceeds with a curing reaction even when irradiated with energy rays having a relatively low energy such as ultraviolet rays.

Examples of the photopolymerization initiator in the first pressure-sensitive adhesive composition (I-3) include the same photopolymerization initiators as those in the first pressure-sensitive adhesive composition (I-1).

The first pressure-sensitive adhesive composition (I-3) may contain only one type or two or more types of the photopolymerization initiators. In a case in which the first pressure-sensitive adhesive composition (I-3) contains two or more types of the photopolymerization initiators, the combination and ratio thereof can be arbitrarily selected.

In the first pressure-sensitive adhesive composition (I-3), the amount of the photopolymerization initiator is preferably 0.01 to 20 parts by mass, more preferably 0.03 to 10 parts by mass, and particularly preferably 0.05 to 5 parts by mass of the total amount (100 parts by mass) of the pressure-sensitive adhesive resin (I-2a) and the energy ray-curable low-molecular-weight compound.

(Other Additives)

The first pressure-sensitive adhesive composition (I-3) may also contain other additives which do not correspond to any of the above-described components as long as the effects of the present invention are not impaired.

Examples of the other additives include the same other additives as those in the first pressure-sensitive adhesive composition (I-1).

The first pressure-sensitive adhesive composition (I-3) may contain only one type or two or more types of other additives. In a case in which the first pressure-sensitive adhesive composition (I-3) contains two or more types of other additives, the combination and ratio thereof can be arbitrarily selected.

In the first pressure-sensitive adhesive composition (I-3), the amount of the other additives is not particularly limited and may be appropriately selected depending on the type of the additives.

(Solvent)

The first pressure-sensitive adhesive composition (I-3) may also contain a solvent for the same purpose as in the case of the first pressure-sensitive adhesive composition (I-1).

Examples of the solvent in the first pressure-sensitive adhesive composition (I-3) include the same solvents as those in the first pressure-sensitive adhesive composition (I-1).

The first pressure-sensitive adhesive composition (I-3) may contain only one type or two or more types of the solvents. In a case in which the first pressure-sensitive adhesive composition (I-3) contains two or more types of the solvents, the combination and ratio thereof can be arbitrarily selected.

In the first pressure-sensitive adhesive composition (I-3), the amount of the solvent is not particularly limited and may be appropriately adjusted.

{First Pressure-Sensitive Adhesive Compositions Other Than First Pressure-Sensitive Adhesive Compositions (I-1) to (I-3)}

Hitherto, the first pressure-sensitive adhesive composition (I-1), the first pressure-sensitive adhesive composition (I-2), and the first pressure-sensitive adhesive composition (I-3) have been mainly described, but the substances described as the contained components thereof can also be used in the same manner in general first pressure-sensitive adhesive compositions other than the above-described three types of first pressure-sensitive adhesive compositions (in the present embodiment, referred to as the first pressure-sensitive adhesive compositions other than the first pressure-sensitive adhesive compositions (I-1) to (I-3)).

Examples of the first pressure-sensitive adhesive compositions other than the first pressure-sensitive adhesive compositions (I-1) to (I-3) include, in addition to, the first energy ray-curable pressure-sensitive adhesive compositions, a first non-energy ray-curable pressure-sensitive adhesive composition.

Examples of the first non-energy ray-curable pressure-sensitive adhesive compositions include non-energy ray-curable pressure-sensitive adhesive compositions containing a pressure-sensitive adhesive resin such as an acrylic resin (a resin having a (meth)acryloyl group), an urethane-based resin (a resin having a urethane bond), a rubber-based resin (a resin having a rubber structure), a silicone-based resin (a resin having a siloxane bond), an epoxy-based resin (a resin having an epoxy group), a polyvinyl ether, or a polycarbonate, and non-energy ray-curable pressure-sensitive adhesive compositions containing an acrylic resin are preferred.

The first pressure-sensitive adhesive compositions other than the first pressure-sensitive adhesive compositions (I-1) to (I-3) preferably contain one or more types of crosslinking agents, and the amount thereof can be set to be the same as that in the case of the above-described first pressure-sensitive adhesive composition (I-1) or the like.

<Method for Manufacturing First Pressure-Sensitive Adhesive Composition>

The first pressure-sensitive adhesive compositions such as the first pressure-sensitive adhesive compositions (I-1) to (I-3) can be obtained by blending individual components for constituting the first pressure-sensitive adhesive compositions such as the pressure-sensitive adhesive, components other than the pressure-sensitive adhesive as necessary, and the like.

The addition order during the blending of the respective components is not particularly limited, and two or more types of components may be added at the same time.

In a case in which the solvent is used, the solvent may be used by mixing the solvent with all of the blending components other than the solvent so as to dilute these blending components in advance or may be used by mixing the solvent with the blending components without diluting all of the blending components other than the solvent in advance.

A method for mixing the respective components during blending is not particularly limited and may be appropriately selected from well-known methods such as a method in which the components are mixed together by rotating a stirring stick, a stirring blade, or the like; a method in which the components are mixed together using a mixer, and a method in which the components are mixed together by applying ultrasonic waves thereto.

The temperature and the time during the addition and mixing of the respective components are not particularly limited as long as the respective blending components do not deteriorate and may be appropriately adjusted, but the temperature is preferably 15° C. to 30° C.

[First Interlayer]

The first interlayer has a sheet form or a film form, and a constituent material thereof may be appropriately selected depending on the purpose and is not particularly limited.

For example, in a case in which the purpose is to suppress the deformation of the first protective film by reflecting the shape of bumps present on a semiconductor surface in the first protective film that covers the semiconductor surface, examples of a preferred constituent material of the first interlayer include urethane (meth)acrylate and the like from the viewpoint of further improving the attachment property of the first interlayer.

The first interlayer may be a single layer (monolayer) or a plurality of two or more layers. In a case in which the first interlayer is a plurality of layers, the respective layers in the plurality of layers may be identical to or different from one another, and the combination of the plurality of layers is not particularly limited.

The thickness of the first interlayer can be appropriately adjusted depending on the height of bumps on the semiconductor surface which is a protection target, but is preferably 50 to 600 μm, more preferably 70 to 500 μm, and particularly preferably 80 to 400 μm since it is possible to relatively easily absorb the influence of bumps having a relatively high height.

Here, "the thickness of the first interlayer" refers to the thickness of the entire first interlayer, and, for example, the thickness of the first interlayer made up of a plurality of layers refers to the total thickness of all of the layers constituting the first interlayer.

{{First Interlayer Forming Composition}}

The first interlayer can be formed using a first interlayer forming composition containing the constituent material.

For example, the first interlayer can be formed at an intended portion by applying the first interlayer forming composition to a target surface on which the first interlayer is to be formed and drying the first interlayer forming composition or curing the first interlayer forming composition by being irradiated with energy rays as necessary. A more specific method for forming the first interlayer will be described below in detail together with methods for forming other layers. The ratio between the amounts of components, which do not gasify at normal temperature, in the first interlayer forming composition is, generally, identical to the ratio between the amounts of the above-described components in the first interlayer. Here, "normal temperature" is as described above.

The first interlayer forming composition may be applied using a well-known method, and examples thereof include methods in which a variety of coaters such as an air knife coater, a blade coater, a bar coater, a gravure coater, a roll coater, a roll knife coater, a curtain coater, a die coater, a knife coater, a screen coater, a Mayer bar coater, and a kiss coater are used.

The drying conditions of the first interlayer forming composition are not particularly limited; however, in a case in which the first interlayer forming composition contains a solvent described below, the first interlayer forming composition is preferably heated and dried, and, in this case, the first interlayer forming composition is preferably dried under conditions of, for example, 70° C. to 130° C. and 10 seconds to 5 minutes.

In a case in which the first interlayer forming composition is energy ray-curable, the first interlayer forming composition is preferably further cured by being irradiated with energy rays after drying.

Examples of the first interlayer forming composition include a first interlayer forming composition containing urethane (meth)acrylate (II-1) and the like.

{First Interlayer Forming Composition (II-1)}

As described above, the first interlayer forming composition (II-1) contains urethane (meth)acrylate.

(Urethane(Meth)acrylate)

The urethane (meth)acrylate is a compound having at least a (meth)acryloyl group and a urethane bond in one molecule and is energy ray-polymerizable.

The urethane (meth)acrylate may be a monofunctional urethane (meth)acrylate (urethane (meth)acrylate having only one (meth)acryloyl group in one molecule) or may be a di- or higher-functional urethane (meth)acrylate (urethane (meth)acrylate having two or more (meth)acryloyl groups in one molecule), that is, a multifunctional urethane (meth) acrylate, but urethane (meth)acrylate having at least one (meth)acryloyl group is preferably used.

Examples of the urethane (meth)acrylate contained in the first interlayer forming composition include urethane (meth) acrylate obtained by further causing a (meth)acrylic compound having a hydroxyl group and a (meth)acryloyl group to react with a terminal isocyanate urethane prepolymer obtained by reacting a polyol compound and a polyhydric isocyanate compound. Here, "the terminal isocyanate urethane prepolymer" refers to a prepolymer having a urethane bond and having an isocyanate group at a terminal portion of the molecule.

The first interlayer forming composition (II-1) may contain only one type or two or more types of the urethane (meth)acrylate. In a case in which the first interlayer forming composition (II-1) contains two or more types of the urethane (meth)acrylate, the combination and ratio thereof can be arbitrarily selected.

(A) Polyol Compound

The polyol compound is not particularly limited as long as the compound has two or more hydroxyl groups in one molecule.

One type of the polyol compound may be used singly or two or more types of the polyol compounds may be used in combination. In a case in which two or more types of the polyol compounds are used in combination, the combination and ratio thereof can be arbitrarily selected.

Examples of the polyol compound include alkylenediol, polyether-type polyols, polyester-type polyols, polycarbonate-type polyols, and the like.

The polyol compound may be any one of a difunctional diol, a trifunctional triol, and tetra- or higher-functional polyols, but a diol is preferred since the diol can be easily procured and is excellent in terms of versatility, reactivity, and the like.

Polyether-Type Polyol

The polyether-type polyol is not particularly limited, but is preferably a polyether-type diol, and examples of the polyether-type diol include compounds represented by General Formula (1).

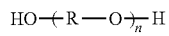  (1)

(Here, in Formula (1), n represents an integer of 2 or more; R represents a divalent hydrocarbon group, and a plurality of R's may be identical to or different from one another)

In Formula (1), n represents the number of repeating units of a group represented by General Formula "—R—O—" and is not particularly limited as long as n is an integer of 2 or more. Among these, n is preferably 10 to 250, more preferably 25 to 205, and particularly preferably 40 to 185.

In Formula (1), R is not particularly limited as long as R is a divalent hydrocarbon group, but is preferably an alkylene group, more preferably an alkylene group having 1 to 6 carbon atoms, still more preferably an ethylene group, a propylene group, or a tetramethylene group, and particularly preferably a propylene group or a tetramethylene group.

The compound represented by Formula (1) is preferably polyethylene glycol, polypropylene glycol or polytetramethylene glycol and more preferably polypropylene glycol or polytetramethylene glycol.

When the polyether-type diol and the polyhydric isocyanate compound are reacted with each other, urethane (meth)acrylate having an ether bond portion represented by General Formula (1a) as the terminal isocyanate urethane prepolymer can be obtained. In addition, when the above-described terminal isocyanate urethane prepolymer is used, the urethane (meth)acrylate has the ether bond portion, that is, has a constituent unit derived from the polyether-type diol.

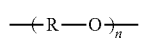  (1a)

(Here, in Formula (1a), R and n are the same as described above)

Polyester-Type Polyol

The polyester-type polyol is not particularly limited, and examples thereof include polyols obtained by causing an esterification reaction using a polybasic acid or a derivative thereof, and the like. Meanwhile, in the present embodiment, unless particularly otherwise described, "a derivative" refers to a compound in which one or more groups are substituted with other groups (substituents). Here, "a group" refers not only to an atomic group formed by bonding a plurality of atoms but also to one atom.

Examples of the polybasic acid or the derivative thereof include polybasic acids that are ordinarily used as a manufacturing raw material of polyesters and derivatives thereof.

Examples of the polybasic acids include saturated aliphatic polybasic acids, unsaturated aliphatic polybasic acids, aromatic polybasic acids, and the like, and dimers corresponding to any of the above-described polybasic acids may also be used.

Examples of the saturated aliphatic polybasic acids include saturated aliphatic dibasic acids such as oxalic acid, malonic acid, succinic acid, glutaric acid, adipic acid, pimelic acid, suberic acid, azelaic acid, and sebacic acid, and the like.

Examples of the unsaturated aliphatic polybasic acids include unsaturated aliphatic dibasic acids such as maleic acid and fumaric acid.

Examples of the aromatic polybasic acids include aromatic dibasic acids such as phthalic acid, isophthalic acid, terephthalic acid, and 2,6-naphthalenedicarboxylic acid; aromatic tribasic acids such as trimellitic acid; aromatic tetrabasic acids such as pyromellitic acid; and the like.

Examples of the derivatives of the polybasic acids include acid anhydrides of the saturated aliphatic polybasic acids, the unsaturated aliphatic polybasic acids, and the aromatic polybasic acids described above, hydrogenated dimer acids, and the like.

One type of the polybasic acid or a derivative thereof may be used singly or two or more types of the polyol compounds may be used in combination. In a case in which two or more types of the polybasic acid or the derivative are used in combination, the combination and ratio thereof can be arbitrarily selected.

The polybasic acid is preferably the aromatic polybasic acid since the aromatic polybasic acid is suitable for the formation of coated films having an appropriate hardness.

In the esterification reaction for obtaining the polyester-type polyol, a well-known catalyst may also be used as necessary.

Examples of the catalyst include tin compounds such as dibutyltin oxide and stannous octanoate; alkoxy titanium such as tetrapropyl titanate; and the like.

Polycarbonate-Type Polyol

The polycarbonate-type polyol is not particularly limited, and examples thereof include polycarbonates obtained by reacting the same glycol as the compound represented by Formula (1) and alkylene carbonate, and the like.

Here, one type of glycol and alkylene carbonate may be used singly or two or more types thereof may be used in combination. In a case in which two or more types of the glycol and alkylene carbonate are used in combination, the combination and ratio thereof can be arbitrarily selected.

The number-average molecular weight computed from the hydroxyl value of the polyol compound is preferably 1,000 to 10,000, more preferably 2,000 to 9,000, and particularly preferably 3,000 to 7,000. When the number-average molecular weight is 1,000 or more, the excess generation of urethane bonds is suppressed, and it becomes easier to suppress the viscoelastic characteristic of the first interlayer. In addition, when the number-average molecular weight is 10,000 or less, the excess softening of the first interlayer is suppressed.

The number-average molecular weight computed from the hydroxyl value of the polyol compound refers to a value computed from the following expression.

[The number-average molecular weight of the polyol compound]=[the number of functional groups in the polyol compound]×56.11×1,000/[the hydroxyl value of the polyol compound (unit: mgKOH/g)]

The polyol compound is preferably the polyether-type polyol and more preferably a polyether-type diol.

(B) Polyhydric Isocyanate Compound

The polyhydric isocyanate compound that is reacted with the polyol compound is not particularly limited as long as the polyhydric isocyanate compound has two or more isocyanate groups.

One type of the polyhydric isocyanate compound may be used singly or two or more types of the polyhydric isocyanate compounds may be used in combination. In a case in which two or more types of the polyhydric isocyanate compounds are used in combination, the combination and ratio thereof can be arbitrarily selected.

Examples of the polyhydric isocyanate compound include chain-like diisocyanates such as tetramethylene diisocyanate, hexamethylene diisocyanate, and trimethylhexamethylene diisocyanate; cyclic aliphatic diisocyanates such as isophorone diisocyanate, norbornane diisocyanate, dicyclohexylmethane-4,4'-diisocyanate, dicyclohexylmethane-2,4'-diisocyanate, and ω,ω'-diisocyanate dimethylcyclohexane; aromatic diisocyanates such as 4,4'-diphenylmethane diisocyanate, tolylene diisocyanate, xylylene diisocyanate, tolylene diisocyanate, tetramethylene xylylene diisocyanate, and naphthalene-1,5-diisocyanate; and the like.

Among these, the polyhydric isocyanate compound is preferably isophorone diisocyanate, hexamethylene diisocyanate, or xylylene diisocyanate from the viewpoint of the handling property.

(C) (Meth)acrylic Compound

The (meth)acrylic compound that is reacted with the terminal isocyanate urethane prepolymer is not particularly limited as long as the compound has at least a hydroxyl group and a (meth)acryloyl group in one molecule.

One type of the (meth)acrylic compound may be used singly or two or more types of the (meth)acrylic compounds may be used in combination. In a case in which two or more types of the (meth)acrylic compounds are used in combination, the combination and ratio thereof can be arbitrarily selected.

Examples of the (meth)acrylic compound include hydroxyl group-containing (meth)acrylic acid esters such as 2-hyroxyethyle (meth)acrylate, 2-hydroxypropyl (meth)acrylate, 3-hydroxypropyl (meth)acrylate, 2-hyroxybutyl (meth)acrylate, 3-hyroxybuyl (meth)acrylate, 4-hydroxybutyl (meth)acrylate, 4-hydroxycyclohexyl (meth)acrylate, 5-hydroxycyclooxtyl (meth)acrylate, 2-hydroxy-3-phenyloxypropyl (meth)acrylate, pentaerythritol tri(meth)acrylate, polyethylene glycol mono(meth)acrylate, and polypropylene glycol mono(meth)acrylate; hydroxyl group-containing (meth)acrylamides such as N-methylol (meth)acrylamide; reactants obtained by reacting (meth)acrylic acid with vinyl alcohol, vinyl phenol, or bisphenol A glycidyl ether; and the like.

Among these, the (meth)acrylic compound is preferably the hydroxyl group-containing (meth)acrylic acid ester, more preferably a hydroxyl group-containing alkyl (meth) acrylate, and particularly preferably 2-hydroxyethyl (meth) acrylate.

The reaction between the terminal isocyanate urethane prepolymer and the (meth)acrylic compound may be caused using a solvent, a catalyst, and the like as necessary.

Conditions during the reaction between the terminal isocyanate urethane prepolymer and the (meth)acrylic compound may be appropriately adjusted, and, for example, the reaction temperature is preferably 60° C. to 100° C., and the reaction time is preferably one to four hours.

The urethane (meth)acrylate may be any of an oligomer, a polymer and a mixture of an oligomer and a polymer and is preferably an oligomer.

For example, the weight-average molecular weight of the urethane (meth)acrylate is preferably 1,000 to 100,000, more preferably 3,000 to 80,000, and particularly preferably 5,000 to 65,000. When the weight-average molecular weight of the weight-average molecular weight of the urethane (meth)acrylate is 1,000 or more, it becomes easy to optimize the hardness of the first interlayer due to the intermolecular force between structures derived from the urethane (meth) acrylate in polymers of the urethane (meth)acrylate and a polymerizable monomer described below.

(Polymerizable Monomer)

The first interlayer forming composition (II-1) may also contain, in addition to the urethane (meth)acrylate, a polymerizable monomer from the viewpoint of further improving the film-forming property.

The polymerizable monomer refers to polymerizable monomers except for oligomers and polymers which are energy ray-polymerizable and have a weight-average molecular weight of 1,000 or more and is preferably a compound having at least one (meth)acryloyl group in one molecule.

Examples of the polymerizable monomer include alkyl (meth)acrylates in which an alkyl group constituting the alkyl ester has 1 to 30 carbon atoms and has a chain-like shape; functional group-containing (meth)acrylic compounds having a functional group such as a hydroxyl group, an amide group, an amino group, or an epoxy group; (meth)acrylic acid esters having an aliphatic cyclic group; (meth)acrylic acid esters having an aromatic hydrocarbon group; (meth)acrylic acid esters having a heterocyclic group; compounds having a vinyl group; compounds having an allyl group; and the like.

Examples of the alkyl (meth)acrylates having a chain-like alkyl group having 1 to 30 carbon atoms include methyl (meth)acrylate, ethyl (meth)acrylate, n-propyl (meth)acrylate, isopropyl (meth)acrylate, n-butyl (meth)acrylate, isobutyl (meth)acrylate, sec-butyl (meth)acrylate, tert-butyl (meth)acrylate, pentyl (meth)acrylate, hexyl (meth)acrylate, heptyl (meth)acrylate, n-octyl (meth)acrylate, isooctyl (meth)acrylate, 2-ethylhexyl (meth)acrylate, n-nonyl (meth) acrylate, isononyl (meth)acrylate, decyl (meth)acrylate, undecyl (meth)acrylate, dodecyl (meth)acrylate (lauryl (meth)acrylate), tridecyl (meth)acrylate, tetradecyl (meth) acrylate (myristyl (meth)acrylate), pentadecyl (meth)acrylate, hexadecyl (meth)acrylate (palmityl (meth)acrylate), heptadecyl (meth)acrylate, octadecyl (meth)acrylate (stearyl (meth)acrylate), isooctadecyl (meth)acrylate (isostearyl (meth)acrylate), nonadecyl (meth)acrylate, icosyl (meth) acrylate, and the like.

Examples of functional group-containing (meth)acrylic derivatives include hydroxyl group-containing (meth) acrylic acid esters such as 2-hydroxyethyl (meth)acrylate, 2-hydroxypropyl (meth)acrylate, 3-hydroxypropyl (meth) acrylate, 2-hydroxybutyl (meth)acrylate, 3-hydroxybutyl (meth)acrylate, and 4-hydroxybutyl (meth)acrylate; (meth) acrylamides such as (meth)acrylamide, N,N-dimethyl (meth)acrylamide, N-butyl (meth)acrylamide, N-methylol (meth)acrylamide, N-methylolpropane (meth)acrylamide, N-methoxymethyl (meth)acrylamide, and N-butoxymethyl (meth)acrylamide and derivatives thereof; (meth)acrylic acid esters having an amino group (hereinafter, in some cases, referred to as "the amino group-containing (meth) acrylic acid esters"); (meth)acrylic acid esters having a monosubstituted amino group which are formed by substituting one hydrogen atom in an amino group with a group other than a hydrogen atom (hereinafter, in some cases, referred to as "the monosubstituted amino group-containing (meth)acrylic acid esters"); (meth)acrylic acid esters having a disubstituted amino group which are formed by substituting two hydrogen atoms in an amino group with groups other than a hydrogen atom (hereinafter, in some cases, referred to as "the disubstituted amino group-containing (meth)acrylic acid esters"); (meth)acrylic acid esters having an epoxy group such as glycidyl (meth)acrylate and methyl glycidyl (meth)acrylate (hereinafter, in some cases, referred to as "the epoxy group-containing (meth)acrylic acid esters"); and the like.

Here, "the amino group-containing (meth)acrylic acid ester" refers to a compound formed by substituting one or more hydrogen atoms in a (meth)acrylic acid ester with an amino group ($—NH_2$). Similarly, "the monosubstituted amino group-containing (meth)acrylic acid ester" refers to a compound formed by substituting one or more hydrogen atoms in a (meth)acrylic acid ester with a monosubstituted amino group, and "the disubstituted amino group-containing (meth)acrylic acid ester" refers to a compound formed by substituting one or more hydrogen atoms in a (meth)acrylic acid ester with a disubstituted amino group.

Examples of the group other than a hydrogen atom which substitutes the hydrogen atom (that is, the substituent) in "the monosubstituted amino group" and "the disubstituted amino group" include alkyl groups and the like.

Examples of the (meth)acrylic acid esters having an aliphatic cyclic group include isobornyl (meth)acrylate, dicyclopentenyl (meth)acrylate, dicyclopentanyl (meth) acrylate, dicyclopentenyloxyethyl (meth)acrylate, cyclohexyl (meth)acrylate, adamantyl (meth)acrylate, and the like.

Examples of the (meth)acrylic acid esters having an aromatic hydrocarbon group include phenyl hydroxypropyl (meth)acrylate, benzyl (meth)acrylate, 2-hyroxy-3-phenoxypropyl (meth)acrylate, and the like.

The heterocyclic group in the (meth)acrylic acid ester having a heterocyclic group may be any of an aromatic heterocyclic group and an aliphatic heterocyclic group. Examples of the (meth)acrylic acid esters having the heterocyclic group include tetrahydrofurfuryl (meth)acrylate, (meth)acryloyl morpholine, and the like.

Examples of the compounds having a vinyl group include styrene, hydroxyethyl vinyl ether, hydroxybutyl vinyl ether, N-vinylformamide, N-vinylpyrrolidone, N-vinylcaprolactam, and the like.

Examples of the compounds having an allyl group include allyl glycidyl ethers and the like.

The polymerizable monomer preferably has a group having a relatively large volume since the compatibility with the urethane (meth)acrylate is favorable. Examples of the polymerizable monomer include (meth)acrylic acid esters having an aliphatic cyclic group, (meth)acrylic acid esters having an aromatic hydrocarbon group, and (meth)acrylic acid esters having a heterocyclic group, and (meth)acrylic acid esters having an aliphatic cyclic group are more preferred.

The first interlayer forming composition (II-1) may contain only one type or two or more types of the polymerizable monomers. In a case in which the first interlayer forming composition (II-1) contains two or more types of the polymerizable monomers, the combination and ratio thereof can be arbitrarily selected.

In the first interlayer forming composition (II-1), the amount of the polymerizable monomer is preferably 10% to 99% by mass, more preferably 15% to 95% by mass, still more preferably 20% to 90% by mass, and particularly preferably 25% to 80% by mass of the total mass of the first interlayer forming composition (II-1).

(Photopolymerization Initiator)

The first interlayer forming composition (II-1) may also contain, in addition to the urethane (meth)acrylate and the polymerizable monomer, a photopolymerization initiator. The first interlayer forming composition (II-1) containing the photopolymerization initiator sufficiently proceeds with a curing reaction even in a case of being irradiated with energy rays having a relatively low energy such as ultraviolet rays.

Examples of the photopolymerization initiator include benzoin compounds such as benzoin, benzoin methyl ether, benzoin ethyl ether, benzoin isopropyl ether, benzoin isobutyl ether, benzoin benzoate, methyl benzoin benzoate, and benzoin dimethyl ketal; acetophenone compounds such as 2-hydroxy-2-methyl-1-phenyl-propane-1-one, and 2,2-dimethoxy-1,2-diphenylethane-1-one; acylphosphine oxide compounds such as bis(2,4,6-trimethylbenzoyl)phenylphosphine oxide; sulfide compounds such as benzylphenyl sulfide and tetramethylthiuram monosulfide; α-ketol compounds such as 1-hydroxycyclohexyl phenyl ketone; azo compounds such as azobisisobutylonitrile; titanocene compounds such as titanocene; thioxanthone compounds such as thioxanthone; peroxide compounds; diketone compounds such as diacetyle; dibenzyl, and the like.

In addition, as the photopolymerization initiator, for example, a quinone compound such as 1-chloroanthraquinone; a photosensitizer such as amine; or the like can also be used.

The first interlayer forming composition (II-1) may contain only one type or two or more types of the photopolymerization initiators. In a case in which the first interlayer forming composition (II-1) contains two or more types of the photopolymerization initiators, the combination and ratio thereof can be arbitrarily selected.

In the first interlayer forming composition (II-1), the amount of the photopolymerization initiator is preferably 0.01 to 20 parts by mass, more preferably 0.03 to 10 parts by mass, and particularly preferably 0.05 to 5 parts by mass of the total amount (100 parts by mass) of the urethane (meth)acrylate and the polymerizable monomer.

(Resin Components Other than Urethane (Meth)Acrylate)

The first interlayer forming composition (II-1) may also contain resin components other than the urethane (meth) acrylate as long as the effects of the present invention are not impaired.

The types of the resin components and the amount thereof in the first interlayer forming composition (II-1) may be appropriately selected depending on the purpose and are not particularly limited.

(Other Additives)

The first interlayer forming composition (II-1) may also contain other additives which do not correspond to any of the above-described components as long as the effects of the present invention are not impaired.

Examples of the other additives include a variety of well-known additives such as a crosslinking agent, an antistatic agent, an antioxidant, a chain transfer, a softening agent (plasticizer), a filler, an antirust agent, and a colorant (a pigment or a dye).

Examples of the chain transfer include thiol compounds having at least one thiol group (mercapto group) in one molecule.

Examples of the thiol compounds include nonyl mercaptan, 1-dodecanethiol, 1,2-ethanedithiol, 1,3-propandithiol, triazinethiol, triazinedithiol, triazinetrithiol, 1,2,3-propanetrithiol, tetraethylene glycol bis(3-mercaptopropionate), trimethylolpropane tris(3-mercaptopropionate), pentaerythritol tetrakis(3-mercaptopropionate), pentaerythritol tetrakisthioglycolate, dipentaerythritol hexakis(3-mercaptopropionate), tris[(3-mercaptopropioniloxy)-ethyl]-isocyanurate, 1,4-bis(3-mercaptobutyryloxy)butane, pentaerythritol tetrakis(3-mercaptobutylate), 1,3,5-tris(3-mercaptobutyloxyethyl)-1,3,5-triazine-2,4,6-(1H,3H,5H)-trione, and the like.

The first interlayer forming composition (II-1) may contain only one type or two or more types of other additives. In a case in which the first interlayer forming composition (II-1) contains two or more types of the other additives, the combination and ratio thereof can be arbitrarily selected.

In the first interlayer forming composition (II-1), the amount of the other additives is not particularly limited and may be appropriately selected depending on the type of the additives.

(Solvent)

The first interlayer forming composition (II-1) may also contain a solvent. When the first interlayer forming composition (II-1) contains a solvent, the coating aptitude to a coating target surface improves.

{{Method for Manufacturing First Interlayer Forming Composition}}

The first interlayer forming composition such as the first interlayer forming composition (II-1) can be obtained by blending individual components for constituting the first interlayer forming composition.

The addition order during the blending of the respective components is not particularly limited, and two or more types of components may be added at the same time.

In a case in which the solvent is used for the first interlayer forming composition, the solvent may be used by mixing the solvent with all of the blending components other than the solvent so as to dilute these blending components in advance or may be used by mixing the solvent with the blending components without diluting all of the blending components other than the solvent in advance.

A method for mixing the respective components during blending is not particularly limited and may be appropriately selected from well-known methods such as a method in which the components are mixed together by rotating a stirring stick, a stirring blade, or the like; a method in which the components are mixed together using a mixer, and a method in which the components are mixed together by applying ultrasonic waves thereto.

The temperature and the time during the addition and mixing of the respective components are not particularly limited as long as the respective blending components do not deteriorate and may be appropriately adjusted, but the temperature is preferably 15° C. to 30° C.

<Curable Resin Film>

As described above, the curable resin film of the present invention is a layer for protecting the plurality of bumps 51 on the surface 5a of the semiconductor wafer 5, and the first protective film 1a is formed by heating or curing with energy ray irradiation.

As described above, the curable resin film 1 of the present invention contains an epoxy-based thermosetting component having a weight-average molecular weight of 200 to 4,000 as the curable component, and is used to form the first protective film 1a by being attached to the surface 5a of the semiconductor wafer 5 having the plurality of bumps 51. The curable resin film 1 forms the first protective film 1a by being attached to the surface 5a of the semiconductor wafer 5 having the bumps 51 with an average peak height h1 of 50 to 400 μm, an average diameter D of 60 to 500 μm, and an average pitch P of 100 to 800 μm, heating the attached curable resin film at 100° C. to 200° C. for 0.5 to 3 hours, and curing the heated curable resin film, and when longitudinal sections of the first protective film 1a and the semiconductor wafer 5 are observed by a scanning electron microscope, a ratio (h3/h1) of an average thickness h3 of the first protective film 1a at a center position between the bumps 51 to an average peak height h1 of the plurality of bumps 51, and a ratio (h2/h1) of an average thickness h2 of the first protective film 1a at a position being in contact with the bumps 51 to the average peak height h1 satisfy a relationship represented by the following expression [{(h2/h1)−(h3/h1)}≤0.1].

In addition, the curable resin film 10 of the present invention is common to the curable resin film 1 in terms of the conditions of the dimensional relationship between the cured first protective film 1a and the plurality of bumps 51, but is different from the curable resin film 1 from the viewpoint of containing the energy ray-curable component having a weight-average molecular weight of 200 to 4,000 as the thermosetting component, and forming the first protective film 1a by being cured and irradiated with energy rays under the curing conditions of illuminance of 50 to 500 mW/cm$^2$, and light intensity of 100 to 2,000 mJ/cm$^2$.

The curable resin film 1 can be formed using the thermosetting resin composition containing a constituent material thereof. The thermosetting resin composition contains the epoxy-based thermosetting component having the weight-average molecular weight of 200 to 4,000.

The physical properties such as viscoelasticity and the like of such a curable resin film 1 can be adjusted by adjusting one or both of the type and amount of the components contained in the thermosetting resin composition. In addition, the weight-average molecular weight of the epoxy-based thermosetting component can also be adjusted to be within the above range by adjusting one or both of the type and amount of the component.

The thermosetting resin composition and a method of manufacturing thereof will be described in detail.

For example, among the contained components of the thermosetting resin composition, particularly, by increasing and decreasing the amount in the composition of the thermosetting component, physical properties such as viscosity of the curable resin film 1 can be adjusted within the preferable range.

Examples of a preferred curable resin film 1 include thermosetting resin layers containing a polymer component (A) and a thermosetting component (B). The polymer component (A) is a component considered to be formed by a polymerization reaction of a polymerizable compound. In addition, the thermosetting component (B) is a component capable of a curing (polymerization) reaction using heat as a trigger of the reaction. Meanwhile, in the present invention, a polycondensation reaction is also considered as the polymerization reaction.

On the other hand, the curable resin film 10 can be formed using an energy ray-curable resin composition containing a constituent material thereof. The energy ray-curable resin composition contains the energy ray-curable component having the weight-average molecular weight of 200 to 4,000.

The physical properties such as viscoelasticity and the like of such a curable resin film 10 can be adjusted by adjusting one or both of the type and amount of the components contained in the energy ray-curable resin composition. In addition, the weight-average molecular weight of the energy ray-curable component can also be adjusted to be within the above range by adjusting one or both of the type and amount of the component.

The curable resin films 1 and 10 may be a sheet made of a single layer (monolayer) or a sheet made of a plurality of layers of two or more layers. In a case in which the curable resin films 1 and 10 is a plurality of layers, the respective layers in the plurality of layers may be identical to or different from one another, and the combination of the plurality of layers is not particularly limited.

In a case where the curable resin films 1 and 10 is made of the plurality of layers, all the layers constituting the curable resin films 1 and 10 may satisfy the conditions of the above constituent component.

The thickness of the curable resin films 1 and 10 is not particularly limited, and for example, is preferably 1 to 100 μm, more preferably 5 to 75 μm, particularly preferably 5 to 50 μm. When the thickness of the curable resin film 1 is equal to or more than the lower limit value, it is possible to form a first protective film 1a having a higher protection function.

Here, "the thickness of the curable resin film" refers to the thickness of the entire curable resin films 1 and 10, and, for example, the thickness of the curable resin films 1 and 10 made up of a plurality of layers refers to the total thickness of all of the layers constituting the curable resin films 1 and 10.

[Thermosetting Resin Composition]

The curable resin film 1 can be formed using the thermosetting resin composition containing a constituent material thereof, that is, the thermosetting resin composition containing at least the thermosetting component. For example, the curable resin film 1 can be formed at an intended portion by applying the thermosetting resin composition to a target surface on which the curable resin film 1 is to be formed and drying the thermosetting resin composition as necessary. The ratio between the amounts of components, which do not gasify at normal temperature, in the thermosetting resin composition is, generally, identical to the ratio between the amounts of the above-described components in the curable resin film 1. Here, "normal temperature" is as described above.

The thermosetting resin composition may be applied using a well-known method, and examples thereof include methods in which a variety of coaters such as an air knife coater, a blade coater, a bar coater, a gravure coater, a roll coater, a roll knife coater, a curtain coater, a die coater, a knife coater, a screen coater, a Mayer bar coater, and a kiss coater are used.

The drying conditions of the thermosetting resin composition are not particularly limited; however, in a case in which the thermosetting resin composition contains a solvent described below, the thermosetting resin composition is preferably heated and dried, and, in this case, the thermosetting resin composition is preferably dried under conditions of, for example, 70° C. to 130° C. and 10 seconds to 5 minutes.

{Thermosetting Resin Composition (III-1)}

Examples of a thermosetting resin composition include the thermosetting resin composition (III-1) (in the present embodiment, simply abbreviated as "thermosetting resin composition (III-1)") containing a polymer component (A) and a thermosetting component (B).

(Polymer Component (A))

The polymer component (A) is a polymer compound for imparting a film-forming property, flexibility, and the like to the curable resin film 1.

The thermosetting resin composition (III-1) and the curable resin film 1 may contain only one type or two or more types of the polymer components (A). In a case in which the polymer component (A) contains two or more types of the thermosetting resin composition (III-1) and the curable resin film 1, the combination and ratio thereof can be arbitrarily selected.

Examples of the polymer component (A) include acrylic resins (resins having a (meth)acryloyl group), polyesters, urethane-based resins (resins having a urethane bond), acrylic urethane resins, silicone-based resins (resin having a siloxane bond), rubber-based resins (resins having a rubber structure), phenoxy resins, thermosetting polyimides, and the like, and acrylic resins are preferred.

Examples of the acrylic resin in the polymer component (A) include well-known acrylic polymers.

The weight-average molecular weight (Mw) of the acrylic resin is preferably 10,000 to 2,000,000 and more preferably 100,000 to 1,500,000. When the weight-average molecular weight of the acrylic resin is equal to or more than the lower limit value, the shape stability (aging stability during storage) of the curable resin film 1 improves. In addition, when the weight-average molecular weight of the acrylic resin is equal to or less than the upper limit value, it becomes easy for the curable resin film 1 to follow the uneven surfaces of adherends, and for example, an effect of further suppressing the generation of voids and the like between an adherend and the curable resin film 1 can be obtained.

The glass transition temperature (Tg) of the acrylic resin is preferably −60° C. to 70° C. and more preferably −30° C. to 50° C. When the Tg of the acrylic resin is equal to or higher than the lower limit value, the adhesive force between the first protective film 1a and the first supporting sheet is suppressed, and thus the peeling property of the first supporting sheet improves. In addition, when the Tg of the acrylic resin is equal to or lower than the upper limit value, the adhesive force of the adherend of the curable resin film 1 and the first protective film 1a improves.

Examples of the acrylic resin include polymers of one or more type of (meth)acrylic acid esters; copolymers of two or more types of monomers selected from (meth)acrylic acid, itaconic acid, vinyl acetate, acrylonitrile, styrene, N-methylol acrylamide, and the like; and the like.

Examples of the (meth)acrylic acid esters constituting the acrylic resin include alkyl (meth)acrylic acid esters in which an alkyl group constituting the alkyl ester has 1 to 18 carbon atoms and has a chain-like shape such as methyl (meth)acrylate, ethyl (meth)acrylate, n-propyl (meth)acrylate, isopropyl (meth)acrylate, n-butyl (meth)acrylate, isobutyl (meth)acrylate, sec-butyl (meth)acrylate, tert-butyl (meth)acrylate, pentyl (meth)acrylate, hexyl (meth)acrylate, heptyl (meth)acrylate, 2-ethylhexyl (meth)acrylate, isooctyl (meth)acrylate, n-octyl (meth)acrylate, n-nonyl (meth)acrylate, isononyl (meth)acrylate, decyl (meth)acrylate, undecyl (meth)acrylate, dodecyl (meth)acrylate (lauryl (meth)acrylate), tridecyl (meth)acrylate, tetradecyl (meth)acrylate (myristyl (meth)acrylate), pentadecyl (meth)acrylate, hexadecyl (meth)acrylate (palmityl (meth)acrylate), heptadecyl (meth)acrylate, and octadecyl (meth)acrylate (stearyl (meth) acrylate), and the like;

cycloalkyl (meth)acrylic acid esters such as isobornyl (meth)acrylate and dicyclopentanyl (meth)acrylate;

aralkyl (meth)acrylic acid esters such as benzyl (meth) acrylate;

cycloalkenyl (meth)acrylic acid esters such as dicyclopentenyl (meth)acrylate;

cycloalkenyloxy alkyl (meth)acrylic acid esters such as dicyclopentenyloxyethyl (meth)acrylate;

imide (meth)acrylate;

glycidyl group-containing (meth)acrylic acid esters such as glycidyl (meth)acrylate;

hydroxyl group-containing (meth)acrylic acid esters such as hydroxymethyl (meth)acrylate, 2-hydroxyethyl (meth) acrylate, 2-hydroxypropyl (meth)acrylate, 3-hydroxypropyl (meth)acrylate, 2-hydorybutyl (meth)acrylate, 3-hydroxybutyl (meth)acrylate, and 4-hydroxybutyl (meth)acrylate; and substituted amino group-containing (meth)acrylic acid esters such as N-methylaminoethyl (meth)acrylate; and the like. Here, "the substituted amino group" refers to a group formed by substituting one or two hydrogen atoms in an amino group with a group other than a hydrogen atom.

The acrylic resin may be, for example, in addition to the (meth)acrylic acid ester, a resin formed by the copolymerization of one or more types of monomers selected from (meth)acrylic acid, itaconic acid, vinyl acetate, acrylonitrile, styrene, N-methylol acrylamide, and the like.

The acrylic resin may contain only one type or two or more types of the monomers. In a case in which the acrylic resin has two or more types of monomers, the combination and ratio thereof can be arbitrarily selected.

The acrylic resin may also have a functional group capable of bonding to other compounds such as a vinyl group, a (meth)acryloyl group, an amino group, a hydroxyl group, a carboxy group, or an isocyanate group. The functional group in the acrylic resin may be bonded to other compounds through a crosslinking agent (F) described below or may be directly bonded to other compounds without the crosslinking agent (F). When the acrylic resin is bonded to other compounds through the functional group, there is a tendency that the reliability of packages obtained using the curable resin film 1 improves.

In the present invention, as the polymer component (A), a thermoplastic resin other than the acrylic resin (hereinafter, in some cases, simply abbreviated as "the thermoplastic resin") may be used singly without using the acrylic resin or may be jointly used with the acrylic resin. When the thermoplastic resin is used, there are cases in which the peeling property of the first protective film 1a from the first supporting sheet 11 improves, it becomes easy for the curable resin film 1 to follow the uneven surfaces of adherends, and the generation of voids and the like between an adherend and the curable resin film 1 is further suppressed.

The weight-average molecular weight of the thermoplastic resin is preferably 1,000 to 100,000 and more preferably 3,000 to 80,000.

The glass transition temperature (Tg) of the thermoplastic resin is preferably −30° C. to 150° C. and more preferably −20° C. to 120° C.

Examples of the thermoplastic resin include polyesters, polyurethanes, phenoxy resins, polybutene, polybutadienes, polystyrenes, and the like.

The thermosetting resin composition (III-1) and the curable resin film 1 may contain only one type or two or more types of the thermoplastic resin. In a case in which the thermoplastic resin contains two or more types of the thermosetting resin composition (III-1) and the curable resin film 1, the combination and ratio thereof can be arbitrarily selected.

In the thermosetting resin composition (III-1), the ratio of the amount of the polymer component (A) (that is, the amount of the polymer component (A) in the curable resin film 1) to the total amount of all of the components other than the solvent is preferably 5% to 85% by mass and more preferably 5% to 80% by mass of the entire mass of the thermosetting resin composition (III-1), regardless of the type of the polymer component (A).

There are cases in which the polymer component (A) corresponds to the thermosetting component (B). In the present invention, in a case in which the thermosetting resin composition (III-1) contains components corresponding both the polymer component (A) and the thermosetting component (B) as described above, the thermosetting resin composition (III-1) is considered to contain the polymer component (A) and the thermosetting component (B).

(Thermosetting Component (B))

The thermosetting component (B) is a component for curing the curable resin film 1 so as to form a rigid first protective film 1a.

The thermosetting resin composition (III-1) and the curable resin film 1 may contain only one type or two or more types of the thermosetting component (B). In a case in which the thermosetting component (B) contains two or more types of the thermosetting resin composition (III-1) and the curable resin film 1, the combination and ratio thereof can be arbitrarily selected.

Examples of the thermosetting component (B) include epoxy-based thermosetting resins, thermosetting polyimides, polyurethanes, unsaturated polyesters, silicone resins, and the like, and epoxy-based thermosetting resins are preferred.

(A) Epoxy-Based Thermosetting Resin

The epoxy-based thermosetting resin is made up of an epoxy resin (B1) and a thermal curing agent (B2).

The thermosetting resin composition (III-1) and the curable resin film 1 may contain only one type or two or more types of the epoxy-based thermosetting resin. In a case in which the epoxy-based thermosetting resin contains two or more types of the thermosetting resin composition (III-1) and the curable resin film 1, the combination and ratio thereof can be arbitrarily selected.

Epoxy Resin (B1)

As the epoxy resin (B1), well-known epoxy resins are exemplary examples. Examples thereof include polyfunctional epoxy resins, biphenyl compounds, bisphenol A diglycidyl ethers and hydrogenated substances thereof, orthocresol novolac epoxy resins, dicyclopentadiene-type epoxy resins, biphenyl-type epoxy resins, bisphenol A-type epoxy resins, bisphenol F-type epoxy resins, phenylene skeleton-type epoxy resins, and the like, and di- or higher-functional epoxy compounds.

As the epoxy resin (B1), an epoxy resin having an unsaturated hydrocarbon group may also be used. The epoxy resin having an unsaturated hydrocarbon group has more favorable compatibility with acrylic resins than epoxy resins not having an unsaturated hydrocarbon group. Therefore, when the epoxy resin having an unsaturated hydrocarbon group is used, the reliability of packages obtained using the curable resin film improves.

Examples of the epoxy resin having an unsaturated hydrocarbon group include compounds formed by converting a part of epoxy groups in a polyfunctional epoxy resin to groups having an unsaturated hydrocarbon group. The above-described compound can be obtained by, for example, an addition reaction of (meth)acrylic acid or a derivative thereof to an epoxy group.

In addition, examples of the epoxy resin having an unsaturated hydrocarbon group include compounds in which a group having an unsaturated hydrocarbon group is directly bonded to an aromatic ring or the like constituting an epoxy resin and the like.

The unsaturated hydrocarbon group is a polymerizable unsaturated group, and specific examples thereof include ethenyl groups (vinyl groups), 2-propenyl group (allyl group), (meth)acryloyl groups, (meth)acrylamide groups, and the like, and acryloyl groups are preferred.

The number-average molecular weight of the epoxy resin (B1) is not particularly limited, but is preferably 300 to 30,000, more preferably 400 to 10,000, and particularly preferably 500 to 3,000 from the viewpoint of the curing property of the curable resin film 1 and the strength and thermal resistance of the first protective film 1a after curing.

The epoxy equivalent of the epoxy resin (B1) is preferably 100 to 1,000 g/eq and more preferably 300 to 800 g/eq.

One type of the epoxy resin (B1) may be used singly or two or more types thereof may be jointly used. In a case in which two or more types of the epoxy resin (B1) are jointly used, the combination and ratio thereof can be arbitrarily selected.

Thermal Curing Agent (B2)

The thermal curing agent (B2) functions as a curing agent of the epoxy resin (B1).

Examples of the thermal curing agent (B2) include compounds having two or more functional groups capable of reacting with an epoxy group in one molecule. Examples of the functional group include phenolic hydroxyl groups, alcoholic hydroxyl groups, an amino group, a carboxy group, groups in which an acid group is turned into an anhydride, and the like, phenolic hydroxyl groups, amino groups, or groups in which an acid group is turned into an anhydride are preferred, and phenolic hydroxyl groups or amino groups are more preferred.

As the thermal curing agent (B2), examples of phenolic curing agents having a phenolic hydroxyl group include polyfunctional phenolic resins, biphenol, novolac-type phenolic resins, dicyclopentadiene-based phenolic resins, aralkylphenolic resins, and the like.

As the thermal curing agent (B2), examples of amine-based curing agents having an amino group include dicyandiamide (hereinafter, in some cases, abbreviated as "DICY"), and the like.

The thermal curing agent (B2) may also have an unsaturated hydrocarbon group.

Examples of the thermal curing agent (B2) having an unsaturated hydrocarbon group include compounds formed by substituting a part of hydroxyl groups in a phenolic resin with groups having an unsaturated hydrocarbon group, compounds formed by directly bonding a group having an unsaturated hydrocarbon group to an aromatic ring of a phenolic resin, and the like.

The unsaturated hydrocarbon group in the thermal curing agent (B2) is identical to the unsaturated hydrocarbon group in the above-described epoxy resin having an unsaturated hydrocarbon group.

In a case in which a phenolic curing agent is used as the thermal curing agent (B2), the thermal curing agent (B2) preferably has a high softening point or glass transition temperature since the peeling property from the first supporting sheet of the first protective film 1a improves.

The number-average molecular weight of the resin component such as a polyfunctional phenolic resin, a novolac-type phenolic resin, a dicyclopentadiene-based phenolic resin, or an aralkylphenolic resin as the thermal curing agent (B2) is preferably 300 to 30,000, more preferably 400 to 10,000, and particularly preferably 500 to 3,000.

The molecular weight of a non-resin component, for example, biphenol or dicyandiamide as the thermal curing agent (B2) is not particularly limited, and is preferably, for example, 60 to 500.

One type of the thermal curing agent (B2) may be used singly or two or more types of the polyol compounds may be used in combination. In a case in which two or more types of the thermal curing agents (B2) are used in combination, the combination and ratio thereof can be arbitrarily selected.

In the thermosetting resin composition (III-1) and the curable resin film 1, the amount of the thermal curing agent (B2) is preferably 0.1 to 500 parts by mass, more preferably 1 to 200 parts by mass of the amount (100 parts by mass) of the epoxy resin (B1). When the amount of the thermal curing agent (B2) is equal to or more than the lower limit value, it becomes easier for the curing of the curable resin film 1 to proceed. In addition, when the amount of the thermal curing agent (B2) is equal to or less than the upper limit value, the moisture absorptivity of the curable resin film 1 decreases, and thus the reliability of packages obtained using the curable resin film 1 further improves.

In the thermosetting resin composition (III-1) and the curable resin film 1, the amount of the thermosetting component (B), for example, the total amount of the epoxy resin (B1) and the thermal curing agent (B2) is preferably 50 to 1,000 parts by mass, more preferably 100 to 900 parts by mass, and particularly preferably 150 to 800 parts by mass of the amount (100 parts by mass) of the polymer component (A). When the amount of the thermosetting component (B) is in the above-described range, the adhesive force between the first protective film 1a and the first supporting sheet is suppressed, and thus the peeling property of the first supporting sheet improves.

(Curing Accelerator (C))

The thermosetting resin composition (III-1) and the curable resin film 1 may also contain a curing accelerator (C). The curing accelerator (C) is a component for adjusting the speed of curing the thermosetting resin composition (III-1).

Examples of preferred curing accelerators (C) include tertiary amines such as triethylene diamine, benzyldimethylamine, triethanolamine, dimethylaminoethanol, and tris(dimethylaminomethyl)phenol; imidazoles (imidazoles in which one or more hydrogen atoms are substituted with groups other than a hydrogen atom) such as 2-methylimidazole, 2-phenyl imidazole, 2-phenyl-4-methylimidazole, 2-phenyl-4,5-dihydroxymethylimidazole, and 2,-phenyl-4-methyl-5-hydroxymethylimidazole; organic phosphines (phosphines in which one or more hydrogen atoms are substituted with organic groups) such as tributyl phosphine, diphenyl phosphine, and triphenyl phosphine; tetraphenyl boron salts such as tetraphenyl phosphonium tetraphenyl borate and triphenyl phosphine tetraphenyl borate; and the like.

The thermosetting resin composition (III-1) and the curable resin film 1 may contain only one type or two or more types of the curing accelerator (C). In a case in which the curing accelerator (C) contains two or more types of the thermosetting resin composition (III-1) and the curable resin film 1, the combination and ratio thereof can be arbitrarily selected.

In a case in which the curing accelerator (C) is used, in the thermosetting resin composition (III-1) and the curable resin film 1, the amount of the curing accelerator (C) is preferably 0.01 to 10 parts by mass and more preferably 0.1 to 5 parts by mass of the amount (100 parts by mass) of the thermosetting component (B). When the amount of the curing accelerator (C) is equal to or more than the lower limit value, the effects of the use of the curing accelerator (C) can be more significantly obtained. When the amount of the curing accelerator (C) is equal to or less than the upper limit value, for example, an effect of suppressing a highly polar curing accelerator (C) migrating toward the adhesion interface with adherends in the curable resin film 1 under high temperature and high humidity conditions and segregating becomes significant, and the reliability of packages obtained using the curable resin film 1 further improves.

(Filler (D))

The thermosetting resin composition (III-1) and the curable resin film 1 may also contain a filler (D). When curable resin film 1 contains the filler (D), it is easy to adjust the coefficient of thermal expansion of the first protective film 1a obtained by curing the curable resin film 1 to be within the above range, and, when this coefficient of thermal expansion is optimized for a subject on which the first protective film 1a is to be formed, the reliability of packages obtained using the curable resin film further improves. In addition, when the curable resin film 1 contains the filler (D), it is also possible to decrease the moisture absorptivity of the first protective film 1a or improving the heat dissipation property.

Further, in the present invention, when the curable resin film 1 contains the filler (D), as described above, it is possible to obtain an effect which can remarkably suppress the large distortion in the concave shape on the cured first protective film 1a.

The filler (D) may be any one of an organic filler and an inorganic filler, but is preferably an inorganic filler.

Examples of preferred inorganic fillers include powder of silica, alumina, talc, calcium carbonate, titanium white, colcothar, silicon carbide, boron nitride, and the like; beads obtained by spherodizing this inorganic filler; surface-modified products of these inorganic fillers; single crystal fibers of these inorganic fillers; glass fibers; and the like.

Among these, the inorganic filler is preferably silica or alumina.

The thermosetting resin composition (III-1) and the curable resin film 1 may contain only one type or two or more types of the filler (D). In a case in which the filler (D) contains two or more types of the thermosetting resin composition (III-1) and the curable resin film 1, the combination and ratio thereof can be arbitrarily selected.

In a case in which the filler (D) is used, in the thermosetting resin composition (III-1), the ratio of the amount of the filler (D) (that is, the amount of the filler (D) in the curable resin film 1) to the total amount of all of the components other than the solvent is preferably 5% to 80% by mass and more preferably 7% to 60% by mass. When the amount of the filler (D) is in the above-described range, the adjustment of the coefficient of thermal expansion becomes easier.

In addition, when the thermosetting resin composition (III-1) and the curable resin film 1 contain the filler (D) having an average particle diameter of 5 to 1,000 nm in the curable resin film 1 which is 5% to 80% of the entire mass of the thermosetting resin composition (III-1), it is possible to obtain an effect which can remarkably suppress the large distortion in the concave shape on the cured first protective film 1a.

(Coupling Agent (E))

The thermosetting resin composition (III-1) and the curable resin film 1 may also contain a coupling agent (E). When a coupling agent having a functional group capable of reacting with an inorganic compound or an organic compound is used as the coupling agent (E), it is possible to improve the adhesiveness and adhesion of the curable resin film 1 to adherends. In addition, when the coupling agent (E) is used, the first protective film 1a obtained by curing the curable resin film 1 is not impaired in the thermal resistance and is improved in terms of the water resistance.

The coupling agent (E) is preferably a compound having a functional group capable of reacting with the functional group in the polymer component (A), the thermosetting component (B), or the like and more preferably a silane coupling agent.

Examples of preferred silane coupling agents include 3-glycidyloxypropyltrimethoxysilane, 3-glycidyloxypropylmethyldiethoxysilane, 3-glycidyloxypropyltriethoxysilane, 3-glycidyloxymethyldiethoxysilane, 2-(3,4-epoxycyclohexyl)ethyltrimethoxysilane, 3-methacryloyloxypropyltrimethoxysilane, 3-aminopropyltrimethoxysilane, 3-(2-aminoethylamino)propyltrimethoxysilane, 3-(2-aminoethylamino)propylmethyldiethoxysilane, 3-(phenylamino)propyltrimethoxysilane, 3-anilinopropyltrimethoxysilane, 3-ureidopropyltrimethoxysilane, 3-mercaptopropyltrimethoxysilane, 3-mercaptopropylmethyldimethoxysilane, bis(3-triethoxysilylpropyl)tetrasulfane, methyltrimethoxysilane, methyltriethoxysilane, vinyltrimethoxysilane, vinyltriacetoxysilane, imidazolesilane, and the like.

The thermosetting resin composition (III-1) and the curable resin film 1 may contain only one type or two or more types of the coupling agent (E). In a case in which the coupling agent (E) contains two or more types of the thermosetting resin composition (III-1) and the curable resin film 1, the combination and ratio thereof can be arbitrarily selected.

In a case where the coupling agent (E) is used, in the thermosetting resin composition (III-1) and the curable resin film 1, the amount of the coupling agent (E) is preferably 0.03 to 20 parts by mass, more preferably 0.05 to 10 parts by mass, and particularly preferably 0.1 to 5 parts by mass of the total amount (100 parts by mass of the polymer component (A) and the thermosetting component (B)). When the amount of the coupling agent (E) is equal to or more than the lower limit value, the effects of the use of the coupling agent (E) such as the improvement of the dispersibility of the filler (D) in resins and the improvement of the adhesiveness of the curable resin film 1 to adherends can be significantly obtained.

In addition, when the amount of the coupling agent (E) is equal to or less than the upper limit value, the generation of outgas is further suppressed.

(Crosslinking Agent (F))

In a case in which a polymer component having a functional group such as a vinyl group which is capable of bonding to other compounds, a (meth)acryloyl group, an amino group, a hydroxyl group, a carboxy group, or an isocyanate group which is capable of reacting with other compounds such as the above-described acrylic resin is used as the polymer component (A), the thermosetting resin composition (III-1) and the curable resin film 1 may also contain a crosslinking agent (F) for bonding and crosslinking the functional group to other compounds. When the functional group is crosslinked to other compound using the crosslinking agent (F), it is possible to adjust the initial adhesive force and the agglomerative force of the curable resin film 1.

Examples of the crosslinking agent (F) include organic polyhydric isocyanate compounds, organic polyhydric imine compounds, metal chelate-based crosslinking agents (crosslinking agents having a metal chelate structure), aziridine-based crosslinking agents (crosslinking agents having an aziridinyl group), and the like.

Examples of the organic polyhydric isocyanate compounds include aromatic polyhydric isocyanate compounds, aliphatic polyhydric isocyanate compounds, and alicyclic polyhydric isocyanate compounds (hereinafter, in some cases, these compounds will be collectively abbreviated as "aromatic polyhydric isocyanate compounds and the like"); timers, isocyanurate bodies, and adduct bodies of the aromatic polyhydric isocyanate compounds and the like; terminal isocyanate urethane prepolymers obtained by reacting the aromatic polyhydric isocyanate compounds and the like and a polyol compound. The "adduct body" refers to a reactant of the aromatic polyhydric isocyanate compound, the aliphatic polyhydric isocyanate compound, or the alicyclic polyhydric isocyanate compound and a low-molecular-weight active hydrogen-containing compound such as ethylene glycol, propylene glycol, neopentyl glycol, trimethylolpropane, or castor oil, and examples thereof include xylylene diisocyanate adducts of trimethylolpropane as described below and the like. In addition, "the terminal isocyanate urethane prepolymer" is as described above.

More specific examples of the organic polyhydric isocyanate compound include 2,4-tolylene diisocyanate; 2,6-tolylene diisocyanate; 1,3-xylylene diisocyanate; 1,4-xylylene diisocyanate; diphenylmethane-4,4'-diisocyanate; diphenylmethane-2,4'-diisocyanate; 3-methyldiphenylmethane diisocyanate; hexamethylene diisocyanate; isophorone diisocyanate; dicyclohexylmethane-4,4'-diisocyanate; dicyclohexylmethane-2,4'-diisocyanate; compounds obtained by adding any one or more types of tolylene diisocyanate, hexamethylene diisocyanate, and xylylene diisocyanate to all or some of hydroxyl groups in a polyol such as trimethylolpropane; lysine diisocyanate; and the like.

Examples of the organic polyhydric imine compounds include N,N'-diphenylmethane-4,4'-bis(1-aziridinecarboxamide), trimethylolpropane tri-β-aziridinylpropionate, tetramethylolmethane-tri-β-aziridinylpropionate, N,N'-toluene-2,4-bis(1-aziridinecarboxamide) triethylene melamine, and the like.

In a case in which the organic polyhydric isocyanate compound is used as the crosslinking agent (F), a hydroxyl group-containing polymer is preferably used as the polymer component (A). In a case in which the crosslinking agent (F) has an isocyanate group and the polymer component (A) has a hydroxyl group, it is possible to simply introduce a crosslinking structure into the curable resin film 1 by a reaction between the crosslinking agent (F) and the polymer component (A).

The thermosetting resin composition (III-1) and the curable resin film 1 may contain only one type of the crosslinking agent (F). In addition, thermosetting resin composition (III-1) and the curable resin film 1 may contain two or more types of the crosslinking agents (F), and in this case, the combination and ratio thereof can be arbitrarily selected.

In a case in which the crosslinking agent (F) is used, in the thermosetting resin composition (III-1), the amount of the crosslinking agent (F) is preferably 0.01 to 20 parts by mass, more preferably 0.1 to 10 parts by mass, and particularly preferably 0.5 to 5 parts by mass of the amount (100 parts by mass) of the polymer component (A). When the amount of the crosslinking agent (F) is equal to or more than the lower limit value, the effects of the use of the crosslinking agent (F) can be significantly obtained. In addition, when the amount of the crosslinking agent (F) is equal to or less than the upper limit value, the excess use of the crosslinking agent (F) is suppressed.

(Energy Ray-Curable Resin (G))

The thermosetting resin composition (III-1) and the curable resin film 1 may contain an energy ray-curable resin (G). When the curable resin film 1 contains the energy ray-curable resin (G), it is possible to change the characteristics by being irradiated with energy rays.

The energy ray-curable resin (G) is obtained by polymerizing (curing) an energy ray-curable compound.

Examples of the energy ray-curable compound include compounds having at least one polymerizable double bond in the molecule, and acrylate-based compounds having a (meth)acryloyl group are preferred.

Examples of the acrylate-based compounds include chain-like aliphatic skeleton-containing (meth)acrylates such as trimethylolpropane tri(meth)acrylate, tetramethylolmethane tetra(meth)acrylate, pentaerythritol tri(meth)acrylate, pentaerythritol tetra(meth)acrylate, dipentaerythritol monohydroxy penta(meth)acrylate, dipentaerythritol hexa(meth)acrylate, 1,4-butylene glycol di(meth)acrylate, and 1,6-hexanediol di(meth)acrylate; cyclic aliphatic skeleton-containing (meth)acrylates such as dicyclopentanyl di(meth)acrylate; polyalkylene glycol (meth)acrylates such as polyethylene glycol di(meth)acrylate; oligo ester (meth)acrylates; urethane (meth)acrylate oligomers; epoxy-modified (meth)acrylates; polyether (meth)acrylates other than the above-described polyalkylene glycol (meth)acrylates; itaconic acid oligomers; and the like.

The weight-average molecular weight of the energy ray-curable compound is preferably 100 to 30,000 and more preferably 300 to 10,000.

Only one type or two or more types of the energy ray-curable compounds may be used for polymerization. In a case in which two or more types of the energy ray-curable compounds are used for polymerization, the combination and ratio thereof can be arbitrarily selected.

The thermosetting resin composition (III-1) may contain only one type or two or more types of the energy ray-curable resins (G). In a case in which the thermosetting resin composition (III-1) contains two or more types of the energy ray-curable resins (G), the combination and ratio thereof can be arbitrarily selected.

The amount of the energy ray-curable resin (G) in the thermosetting resin composition (III-1) is preferably 1% to 95% by mass, more preferably 5% to 90% by mass, and particularly preferably 10% to 85% by mass, of the entire mass of the thermosetting resin composition (III-1).

(Photopolymerization Initiator (H))

In the case of containing the energy ray-curable resin (G), the thermosetting resin composition (III-1) may also contain a photopolymerization initiator (H) in order to cause the polymerization reaction of the energy ray curable resin (G) to more efficiently proceed.

Examples of the photopolymerization initiator (H) include benzophenone, acetophenone, benzoin, benzoin methyl ether, benzoin ethyl ether, benzoin isopropyl ether, benzoin isobutyl ether, benzoin benzoic acid, benzoin benzoate methyl, benzoin dimethyl ketal, 2,4-diethylthioxanthone, 1-hydroxycyclohexyl phenyl ketone, benzyl diphenyl sulfide, tetramethylthiuram monosulfide, azobisisobutyronitrile, benzyl, dibenzyl, diacetyl, 1,2-diphenylmethane, 2-hydroxy-2-methyl-1-[4-(1-methylvinyl) phenyl] propanone, 2,4,6-trimethylbenzoyldiphenylphosphine oxide, and 2-chloroanthraquinone.

The thermosetting resin composition (III-1) may contain only one type or two or more types of the photopolymerization initiators (H). In a case in which the thermosetting resin composition (III-1) contains two or more types of the photopolymerization initiators (H), the combination and ratio thereof can be arbitrarily selected.

The amount of the photopolymerization initiators (H) in the thermosetting resin composition (III-1) is preferably 0.1 to 20 parts by mass, more preferably 1 to 10 parts by mass, and particularly preferably 2 to 5 parts by mass of the amount (100 parts by mass) of the energy ray-curable resin (G).

(Versatile Additive (I))

The thermosetting resin composition (III-1) and the curable resin film 1 may also contain a versatile additive (I) as long as the effects of the present invention are not impaired.

The versatile additive (I) may be a well-known versatile additive, can be arbitrarily selected depending on the purpose, and is not particularly limited, and examples of preferred versatile additives include a plasticizer, an antistatic agent, an antioxidant, a colorant (a pigment or a dye), a gettering agent, and the like.

The thermosetting resin composition (III-1) and the curable resin film 1 may contain only one type or two or more types of the versatile additive (I). In a case in which the thermosetting resin composition (III-1) and the curable resin film 1 contain two or more types of the versatile additive (I), the combination and ratio thereof can be arbitrarily selected.

The amount of the versatile additive (I) in the thermosetting resin composition (III-1) and the curable resin film 1 is not particularly limited and may be appropriately selected depending on the purpose.

(Solvent)

The thermosetting resin composition (III-1) preferably further contains a solvent. The thermosetting resin composition (III-1) containing a solvent improves in terms of the handling property.

The solvent is not particularly limited, but preferred examples thereof include hydrocarbons such as toluene and xylyene; alcohols such as methanol, ethanol, 2-propanol, isobutyl alcohol (2-methyl propane-1-ol), and 1-butanol; esters such as ethyl acetate; ketones such as acetone and methyl ethyl ketone; ethers such as tetrahydrofuran; amides (compounds having an amide bond) such as dimethyl formamide and N-methyl pyrrolidone, and the like.

The thermosetting resin composition (III-1) may contain only one type or two or more types of the solvents. In a case in which the thermosetting resin composition (III-1) contains two or more types of the solvents, the combination and ratio thereof can be arbitrarily selected.

The solvent contained in the thermosetting resin composition (III-1) is preferably methyl ethyl ketone or the like since it is possible to more uniformly mix the components contained in the thermosetting resin composition (III-1).

{{Method of Manufacturing Thermosetting Resin Composition}}

The thermosetting resin composition such as the thermosetting resin composition (III-1) can be obtained by blending individual components for constituting the thermosetting resin composition.

The addition order during the blending of the respective components is not particularly limited, and two or more types of components may be added at the same time.

In a case in which the solvent is used, the solvent may be used by mixing the solvent with all of the blending components other than the solvent so as to dilute these blending components in advance or may be used by mixing the solvent with the blending components without diluting all of the blending components other than the solvent in advance.

A method for mixing the respective components during blending is not particularly limited and may be appropriately selected from well-known methods such as a method in which the components are mixed together by rotating a stirring stick, a stirring blade, or the like; a method in which the components are mixed together using a mixer, and a method in which the components are mixed together by applying ultrasonic waves thereto.

The temperature and the time during the addition and mixing of the respective components are not particularly limited as long as the respective blending components do not deteriorate and may be appropriately adjusted, but the temperature is preferably 15° C. to 30° C.

[Energy Ray-Curable Resin Composition]

Hereinafter, an energy ray-curable resin composition forming the curable resin film 10 of the present invention will be described in detail. The curable resin film 10 can be formed using an energy ray-curable resin composition containing a constituent material thereof. For example, the curable resin film 1 can be formed at an intended portion by applying the energy ray-curable resin composition to a target surface on which the curable resin film 1 is to be formed and drying the curable resin composition as necessary. The ratio between the amounts of components, which do not gasify at normal temperature, in the energy ray-curable resin composition is, generally, identical to the ratio between the amounts of the above-described components in the curable resin film. Here, "normal temperature" is as described above.

The energy ray-curable resin composition contains an energy ray-curable component (a).

The energy ray-curable component (a) is preferably uncured and is preferably pressure-sensitive adhesive and more preferably uncured and pressure-sensitive adhesive. Here, "energy rays" and "being energy ray-curable" are as described above.

The curable resin film 10 formed of the energy ray-curable resin composition may be a sheet made of a single layer (monolayer) or a sheet made of a plurality of layers of two or more layers. In a case in which the curable resin film 10 formed of the energy ray-curable resin composition is a plurality of layers, the respective layers in the plurality of layers may be identical to or different from one another, and the combination of the plurality of layers is not particularly limited.

The thickness of the curable resin film 10 is preferably 1 to 100 μm, more preferably 5 to 75 μm, and particularly preferably 5 to 50 μm When the thickness of the curable resin film 10 formed of the energy ray-curable resin composition is equal to or more than the lower limit value, it is possible to form a first protective film 1a having a higher protection function. In addition, when the thickness of the curable resin film 10 is equal to or less than the upper limit value, excessive thickness is suppressed.

Here, "the thickness of the curable resin film 10" refers to the thickness of the entire curable resin film 10 formed of the energy ray-curable resin composition, and, for example, the thickness of the curable resin film 10 made up of a plurality of layers refers to the total thickness of all of the layers constituting the curable resin film 10.

The energy ray-curable resin composition may be applied using a well-known method, and examples thereof include methods in which a variety of coaters such as an air knife coater, a blade coater, a bar coater, a gravure coater, a roll coater, a roll knife coater, a curtain coater, a die coater, a knife coater, a screen coater, a Mayer bar coater, and a kiss coater are used.

The drying conditions of the energy ray-curable resin composition are not particularly limited; however, in a case in which the energy ray-curable resin composition contains a solvent described below, the energy ray-curable resin layer forming composition is preferably heated and dried, and, in this case, the curable resin composition is preferably dried under conditions of, for example, 70° C. to 130° C. and 10 seconds to five minutes.

{{Energy Ray-Curable Resin Composition (IV-1)}}

Examples of the energy ray-curable resin composition include an energy ray-curable resin composition (IV-1) containing an energy ray-curable component (a).

{Energy Ray-Curable Component (a)} The energy ray-curable component (a) is a component that is cured by being irradiated with energy rays and is a component for imparting a film-forming property, flexibility, and the like to the curable resin film 10.

Examples of the energy ray-curable component (a) include a polymer (a1) which has an energy ray-curable group and a weight-average molecular weight of 80,000 to 2,000,000 and a compound (a2) which has an energy ray-curable group and a molecular weight of 100 to 80,000. The polymer (a1) may be a polymer at least a part of which is crosslinked with a crosslinking agent or a polymer which is not crosslinked.

(Polymer Having Energy Ray-Curable Group and Weight-Average Molecular Weight of 80,000 to 2,000,000 (a1))

Examples of the polymer (a1) which has an energy ray-curable group and a weight-average molecular weight of 80,000 to 2,000,000 include an acrylic resin (a1-1) formed by polymerizing an acrylic polymer (a11) having a functional group capable of reacting with groups in other compounds and an energy ray-curable compound (a12) having a group that reacts with the functional group and an energy ray-curable group such as an energy ray-curable double bond.

Examples of the functional group capable of reacting with groups in other compounds include a hydroxyl group, a carboxy group, an amino group, a substituted amino group (a group formed by substituting one or two hydrogen atoms in an amino group with a group other than a hydrogen atom), an epoxy group, and the like. Here, the functional group is preferably a group other than a carboxy group from the viewpoint of preventing the corrosion of circuits such as semiconductor wafers or semiconductor chips.

Among these, the functional group is preferably a hydroxyl group.

Acrylic Polymer Having Functional Group (a11)

Examples of the acrylic polymer (a11) having the functional group include acrylic polymers formed by copolymerizing an acrylic monomer having the above-described functional group and an acrylic monomer not having the above-described functional group, and the acrylic polymer may be an acrylic polymer formed by copolymerizing the above-described monomers and, furthermore, a monomer other than acrylic monomers (non-acrylic monomer).

In addition, the acrylic polymer (a11) may be a random copolymer or a block copolymer.

Examples of the acrylic monomer having the functional group include hydroxyl group-containing monomers, carboxy group-containing monomers, amino group-containing monomers, substituted amino group-containing monomers, epoxy group-containing monomers, and the like.

Examples of the hydroxyl group-containing monomers include hydroxyalkyl (meth)acrylates such as hydroxymethyl (meth)acrylate, 2-hydroxyethyl (meth)acrylate, 2-hydroxypropyl (meth)acrylate, 3-hydroxypropyl (meth)acrylate, 2-hydroxybutyl (meth)acrylate, 3-hydroxybutyl (meth)acrylate, and 4-hydroxybutyl (meth)acrylate; non-(meth)acrylic unsaturated alcohols such as vinyl alcohol and allyl alcohol (unsaturated alcohols not having a (meth)acryloyl skeleton); and the like.

Examples of the carboxy group-containing monomers include ethylenic unsaturated monocarboxylic acids such as (meth)acrylic acid and crotonic acid (monocarboxylic acids having an ethylenic unsaturated bond); ethylenic unsaturated dicarboxylic acids such as fumaric acid, itaconic acid, maleic acid, and citraconic acid (dicarboxylic acids having an ethylenic unsaturated bond); anhydrides of the ethylenic unsaturated dicarboxylic acid; carboxyalkyl (meth)acrylates such as 2-carboxyethyl methacrylate; and the like.

The acrylic monomer having the functional group is preferably the hydroxyl group-containing monomer or the carboxy group-containing monomer and more preferably the hydroxyl group-containing monomer.

The acrylic polymer (a11) may be constituted of only one type or two or more types of the acrylic monomers having the functional group. In a case in which the acrylic polymer (a11) is constituted of two or more types of the acrylic monomers having the functional group, the combination and ratio thereof can be arbitrarily selected.

Examples of the acrylic monomer not having the functional group include alkyl (meth)acrylates in which an alkyl group constituting the alkyl ester has 1 to 18 carbon atoms and has a chain-like shape such as methyl (meth)acrylate, ethyl (meth)acrylate, n-propyl (meth)acrylate, isopropyl (meth)acrylate, n-butyl (meth)acrylate, isobutyl (meth)acrylate, sec-butyl (meth)acrylate, tert-butyl (meth)acrylate, pentyl (meth)acrylate, hexyl (meth)acrylate, heptyl (meth)acrylate, 2-ethylhexyl (meth)acrylate, isooctyl (meth)acrylate, n-octyl (meth)acrylate, n-nonyl (meth)acrylate, isononyl (meth)acrylate, decyl (meth)acrylate, undecyl (meth)acrylate, dodecyl (meth)acrylate (lauryl (meth)acrylate), tridecyl (meth)acrylate, tetradecyl (meth)acrylate (myristyl (meth)acrylate), pentadecyl (meth)acrylate, hexadecyl (meth)acrylate (palmityl (meth)acrylate), heptadecyl (meth)acrylate, and octadecyl (meth)acrylate (stearyl (meth)acrylate) and the like.

In addition, examples of the acrylic monomer not having the functional group also include alkoxyalkyl group-containing (meth)acrylic acid esters such as methoxymethyl (meth)acrylate, methoxyethyl (meth)acrylate, ethoxymethyl (meth)acrylate, and ethoxyethyl (meth)acrylate; (meth)acrylic acid esters having an aromatic group which includes (meth)acrylic acid aryl ester such as phenyl (meth)acrylate or the like; non-crosslinkable (meth)acrylamides and derivatives thereof; (meth)acrylic acid esters having a non-crosslinkable tertiary amino group such as N,N-dimethyl aminoethyl (meth)acrylate and N,N-dimethyl aminopropyl (meth) acrylate; and the like.

The acrylic polymer (a11) may be constituted of only one type or two or more types of the acrylic monomers not having the functional group. In a case in which the acrylic polymer (a11) is constituted of two or more types of the acrylic monomers not having the functional group, the combination and ratio thereof can be arbitrarily selected.

Examples of the non-acrylic monomer include olefins such as ethylene and norbornene; vinyl acetate; styrene; and the like.

The acrylic polymer (a11) may be constituted of only one type or two or more types of the non-acrylic monomers. In a case in which the acrylic polymer (a11) is constituted of two or more types of the non-acrylic monomers, the combination and ratio thereof can be arbitrarily selected.

The ratio (amount of a constituent unit derived from the acrylic monomer having the functional group to the entire mass of constituent units constituting the acrylic polymer (a11) is preferably 0.1% to 50% by mass, more preferably 1% to 40% by mass, and particularly preferably 3% to 30% by mass. When the ratio is in the above-described range, in the acrylic resin (a1-1) obtained by polymerization between the acrylic polymer (a11) and the energy ray-curable compound (a12), it becomes possible to easily adjust the degree of curing of the first protective film to a preferred range with the amount of the energy ray-curable group.

The acrylic polymer (a11) may be constituted of only one type or two or more types of the acrylic resins (a1-1). In a case in which the acrylic polymer (a11) is constituted of two or more types of the acrylic resins (a1-1), the combination and ratio thereof can be arbitrarily selected.

In the energy ray-curable energy ray-curable resin composition (IV-1), the amount of the acrylic resin (a1-1) is preferably 1% to 60% by mass, more preferably 3% to 50% by mass, and particularly preferably 5% to 40% by mass of the entire mass of the energy ray-curable resin composition (IV-1).

Energy Ray-Curable Compound (a12)

The energy ray-curable compound (a12) is preferably an energy ray-curable compound having one or more types of groups selected from the group consisting of an isocyanate group, an epoxy group, and a carboxy group as the group capable of reacting with the functional group in the acrylic polymer (a11) and more preferably an energy ray-curable compound having an isocyanate group as the above-described group. For example, in a case in which the energy ray-curable compound (a12) has an isocyanate group as the above-described group, this isocyanate group easily reacts with a hydroxyl group in the acrylic polymer (a11) having the hydroxyl group as the functional group.

The number of the energy ray-curable groups in one molecule of the energy ray-curable compound (a12) is preferably 1 to 5 and more preferably 1 or 2.

Examples of the energy ray-curable compound (a12) include 2-methacryloyloxyethyl isocyanate, methaisopropenyl-α,α-dimethylbenzyl isocyanate, methacryloyl isocyanate, ally isocyanate, 1,1-(bisacryloyloxymethyl)ethyl isocyanate;

acryloyl monoisocyanate compounds obtained by a reaction between a diisocyante compound or a polyisocyanate compound and hydroxyethyl (meth)acrylate; and acryloyl monoisocyanate compounds obtained from a reaction among a diisocyante compound or a polyisocyanate compound, a polyol compound, and hydroxyethyl (meth)acrylate; and the like.

Among these, the energy ray-curable compound (a12) is preferably 2-methacryloyloxyethyl isocyanate.

The energy ray-curable compound (a12) may be constituted of only one type or two or more types of the acrylic resins (a1-1). In a case in which the energy ray-curable compound (a12) is constituted of two or more types of the acrylic resins (a1-1), the combination and ratio thereof can be arbitrarily selected.

The ratio of the amount of an energy ray-curable group derived from the energy ray-curable compound (a12) to the amount of the functional group derived from the acrylic polymer (a11) in the acrylic resin (a1-1) is preferably 20 to 120 mol %, more preferably 35 to 100 mol %, and particularly preferably 50 to 100 mol %. When the ratio of the amount is in the above-described range, the adhesive force of the first protective film after curing becomes stronger. Meanwhile, in a case in which the energy ray-curable compound (a12) is a monofunctional compound (having one group in one molecule), the upper limit value of the ratio of the amount becomes 100 mol %; however, in a case in which the energy ray-curable compound (a12) is a polyfunctional compound (having two or more groups in one molecule), the upper limit value of the ratio of the amount exceeds 100 mol % in some cases.

The weight-average molecular weight (Mw) of the polymer (a1) is preferably 100,000 to 2,000,000 and more preferably 300,000 to 1,500,000.

Here, "the weight-average molecular weight" is as described above.

In a case in which at least a part of the polymer (a1) is crosslinked with a crosslinking agent, the polymer (a1) may be a polymer that is formed by polymerizing monomers which do not correspond to any of the monomers described above as the monomers constituting the acrylic polymer (a11) and have a group that reacts with the crosslinking agent and is crosslinked in the group that reacts with the crosslinking agent or may be a polymer crosslinked in a group which is derived from the energy ray-curable compound (a12) and reacts with the functional group.

The energy ray-curable resin composition (IV-1) and the curable resin film 10 may contain only one type or two or more types of the polymers (a1). In a case in which the energy ray-curable resin composition (IV-1) and the curable resin film 10 contain two or more types of the polymers (a1), the combination and ratio thereof can be arbitrarily selected.

(Compound Having Energy Ray-Curable Group and Weight-average molecular weight of 100 to 80,000 (a2))

Examples of the energy ray-curable group having the compound (a2) which has an energy ray-curable group and a weight-average molecular weight of 100 to 80,000 include groups having an energy ray-curable double bond, and preferred examples thereof include a (meth)acryloyl group, a vinyl group, and the like.

The compound (a2) is not particularly limited as long as the compound satisfies the above-described conditions, and examples thereof include low-molecular-weight compounds having an energy ray-curable group, epoxy resins having an energy ray-curable group, phenolic resins having an energy ray-curable group, and the like.

Among the compound (a2), examples of the low-molecular-weight compounds having an energy ray-curable group include polyfunctional monomers, oligomers, and the like, and acrylate-based compounds having a (meth)acryloyl group are preferred.

Examples of the acrylate compounds include difunctional (meth)acrylates such as 2-hydroxy-3-(meth)acryloyloxy-propoyl methacrylate, polyethylene glycol di(meth)acrylate, propoxylated ethoxylated bisphenol A di(meth)acrylate, 2,2-bis[4-((meth)acryloxypolyethoxy)phenyl]propane, ethoxylated bisphenol A di(meth)acrylate, 2,2-bis[4-((meth)acryloxydiethoxy)phenyl]propane, 9,9-bis[4-(2-(meth)acryloyloxyethoxy)phenyl]fluorene, 2,2-bis[4-((meth)acryloxypolypropoxy)phenyl]propane, tricyclodecanedimethanol di(meth)acrylate, 1,10-decanediol di(meth)acrylate, 1,6-hexanediol di(meth)acrylate, 1,9-nonanediol di(meth)acrylate, dipropylene glycol di(meth)acrylate, tripropylene glycol di(meth)acrylate, polypropylene glycol di(meth)acrylate, polytetramethylene glycol di(meth)acrylate, ethylene glycol di(meth)acrylate, diethylene glycol di(meth)acrylate, triethylene glycol di(meth)acrylate, 2,2-bis[4-((meth)acryloylethoxy)phenyl]propane, neopentyl glycol di(meth)acrylate, ethoxylated polypropylene glycol di(meth)acrylate, and 2-hydroxy-1,3-di(meth)acryloxypropane;

polyfunctional (meth)acrylates such as tris(2-(meth)acryloxyethyl) isocyanurate, ε-caprolacton-modified tris-(2-(meth)acryloxyethyl) isocyanurate, ethoxylated glycerin tri(meth)acrylate, pentaerythritol tri(meth)acrylate, trimethylolpropane tri(meth)acrylate, ditrimethylolpropane tetra(meth)acrylate, ethoxylated pentaerythritol tetra(meth)acrylate, pentaerythritol tetra(meth)acrylate, dipentaerythritol poly(meth)acrylate, and dipentaerythritol hexa(meth)acrylate;

polyfunctional (meth)acrylate oligomers such as urethane (meth)acrylate oligomers; and the like.

Among the compound (a2), as the epoxy resins having an energy ray-curable group, the phenolic resins having an energy ray-curable group, for example, the epoxy resins described in Paragraph 0043 and the like of "Japanese Unexamined Patent Application, First Publication No. 2013-194102" can be used. These resins also correspond to resins constituting a thermosetting component described below; however, in the present invention, the resins will be handled as the compound (a2).

The weight-average molecular weight of the compound (a2) is preferably 100 to 30,000 and more preferably 300 to 10,000.

The energy ray-curable resin composition (IV-1) and the curable resin film 10 may contain only one type or two or more types of the compounds (a2). In a case in which the energy ray-curable resin composition (IV-1) and the curable resin film 10 contain two or more types of the compounds (a2), the combination and ratio thereof can be arbitrarily selected.

{Polymer not Having Energy Ray-Curable Group (b)}

In the case where the energy ray-curable resin composition (IV-1) and the curable resin film 10 contain the compound (a2) as the energy ray-curable component (a), the energy ray-curable resin composition (IV-1) and the energy ray-curable resin layer preferably further contain a polymer (b) not having any energy ray-curable groups. The polymer (b) may be a polymer at least a part of which is crosslinked with a crosslinking agent or a polymer which is not crosslinked.

Examples of the polymer (b) not having any energy ray-curable group include acrylic polymers, phenoxy resins, urethane resins, polyesters, rubber-based resins, acrylic urethane resins, and the like.

Among these, the polymer (b) is preferably an acrylic polymer (hereinafter, in some cases, abbreviated as "the acrylic polymer (b-1)").

The acrylic polymer (b-1) may be a well-known acrylic polymer, and, for example, the acrylic polymer may be a homopolymer of one type of acrylic monomer, a copolymer of two or more types of acrylic monomers. In addition, the acrylic polymer (b-1) may be a copolymer of one or more types of acrylic monomers and one or more types of monomers other than acrylic monomers (non-acrylic monomers).

Examples of the acrylic monomer constituting the acrylic polymer (b-1) include alkyl (meth)acrylates, (meth)acrylic acid ester having a cyclic skeleton, glycidyl group-containing (meth)acrylic acid ester, hydroxyl group-containing (meth)acrylic acid esters, and substituted amino group-containing (meth)acrylic acid esters. Here, "substituted amino group" is as described above.

Examples of the alkyl (meth)acrylates include alkyl (meth)acrylates in which an alkyl group constituting the alkyl ester has 1 to 18 carbon atoms and has a chain-like shape such as methyl (meth)acrylate, ethyl (meth)acrylate, n-propyl (meth)acrylate, isopropyl (meth)acrylate, n-butyl (meth)acrylate, isobutyl (meth)acrylate, sec-butyl (meth)acrylate, tert-butyl (meth)acrylate, pentyl (meth)acrylate, hexyl (meth)acrylate, heptyl (meth)acrylate, 2-ethylhexyl (meth)acrylate, isooctyl (meth)acrylate, n-octyl (meth)acrylate, n-nonyl (meth)acrylate, isononyl (meth)acrylate, decyl (meth)acrylate, undecyl (meth)acrylate, dodecyl (meth)acrylate (lauryl (meth)acrylate), tridecyl (meth)acrylate, tetradecyl (meth)acrylate (myristyl (meth)acrylate), pentadecyl (meth)acrylate, hexadecyl (meth)acrylate (palmityl (meth)acrylate), heptadecyl (meth)acrylate, and octadecyl (meth)acrylate (stearyl (meth)acrylate) and the like.

Examples of the (meth)acrylic acid esters having a cyclic skeleton include cycloalkyl (meth)acrylic acid esters such as isobornyl (meth)acrylate and dicyclopentanyl (meth)acrylate;

aralkyl (meth)acrylic acid esters such as benzyl (meth)acrylate;

cycloalkenyl (meth) acrylic acid esters such as dicyclopentenyl (meth) acrylic acid esters;

cycloalkenyloxy alkyl (meth) acrylic acid esters such as dicyclopentenyloxyethyl (meth) acrylic acid esters; and the like.

Examples of the glycidyl group-containing (meth)acrylic acid esters include glycidyl (meth)acrylate and the like.

Examples of the hydroxyl group-containing (meth)acrylic acid esters include hydroxymethyl (meth)acrylate, 2-hydroxyethyl (meth)acrylate, 2-hydroxypropyl (meth)acrylate, 3-hydroxypropyl (meth)acrylate, 2-hydorybutyl (meth)acrylate, 3-hydroxybutyl (meth)acrylate, 4-hydroxybutyl (meth)acrylate, and the like.

Examples of the substituted amino group-containing (meth)acrylic acid esters include N-methylaminoethyl (meth)acrylate and the like.

Examples of the non-acrylic monomer constituting the acrylic polymer (b-1) include olefins such as ethylene and norbornene; vinyl acetate; styrene; and the like.

Examples of the polymer (b) at least a part of which is crosslinked with a crosslinking agent and which does not have the energy ray-curable group include polymers in which a reactive functional group in the polymer (b) reacts with a crosslinking agent.

The reactive functional group may be appropriately selected depending on the type and the like of the crosslinking agent and is not particularly limited. For example, in a case in which the crosslinking agent is a polyisocyanate compound, examples of the reactive functional group include a hydroxyl group, a carboxy group, an amino group, and the like, and, among these, the hydroxyl group that is highly reactive with isocyanate groups is preferred. In addition, in a case in which the crosslinking agent is an epoxy-based compound, examples of the reactive functional group include a carboxy group, an amino group, an amide group, and the like, and, among these, the carboxy group that is highly reactive with epoxy groups is preferred. Here, the reactive functional group is preferably a group other than a carboxy group from the viewpoint of preventing the corrosion of circuits such as semiconductor wafers or semiconductor chips.

Examples of the polymer (b) which has the reactive functional group but does not have any energy ray-curable groups include polymers obtained by polymerizing monomers having at least the reactive functional group. In the case of the acrylic polymer (b-1), as any one or both of the acrylic monomer and the non-acrylic monomer that have been exemplified as the monomers constituting the acrylic polymer, monomers having the reactive functional group may be used. For example, examples of the polymer (b) having a hydroxyl group as the reactive functional group include polymers obtained by polymerizing hydroxyl group-containing (meth)acrylic acid ester and also include polymers obtained by polymerizing monomers formed by substituting one or more hydrogen atoms in the previously exemplary examples of an acrylic monomer or non-acrylic monomer with the reactive functional group.

In the polymer (b) having the reactive functional group, the ratio (amount) of the amount of a constituent unit derived from a monomer having the reactive functional group is preferably 1 to 20% by mass and more preferably 2 to 10% by mass of the entire mass of constituent units constituting the polymer. When the ratio is in the above-described range, in the polymer (b), the degree of crosslinking is in a more preferred range.

The weight-average molecular weight (Mw) of the polymer (b) not having any energy ray-curable groups is preferably 10,000 to 2,000,000 and more preferably 100,000 to 1,500,000 since the film-forming property of the energy ray curable resin composition (IV-1) becomes more preferable.

Here, "the weight-average molecular weight" is as described above.

The energy ray curable resin composition (IV-1) energy ray-curable resin composition (IV-1) and the curable resin film 10 may contain only one type or two or more types of the polymers (b) not having any energy ray-curable groups. In a case in which the energy ray curable resin composition (IV-1) and the curable resin film 10 contain two or more types of the polymers (b) not having any energy ray-curable groups, the combination and ratio thereof can be arbitrarily selected.

Examples of the energy ray-curable resin composition (IV-1) include compositions containing any one or both of the polymer (a1) and the compound (a2).

In the case of containing the compound (a2), the energy ray-curable resin composition (IV-1) preferably further contains a polymer (b) not having an energy ray-curable group, and in this case, the polymer (a1) is further preferably contained. In addition, the energy ray-curable resin composition (IV-1) may contain the polymer (a1) and the polymer (b) not having any energy ray-curable groups without containing the compound (a2).

In a case where the energy ray-curable resin composition (IV-1) contains the polymer (a1), the compound (a2), and the polymer (b) not having any energy ray-curable groups, in the energy ray-curable resin composition (IV-1), the amount of the compound (a2) is preferably 10 to 400 parts by mass, and more preferably 30 to 350 parts by mass of the total amount (100 parts by mass) of the polymer (a1) and the polymer (b) not having any energy ray-curable groups.

In the energy ray-curable resin composition (IV-1), the ratio of the total amount of the energy ray-curable component (a) and the polymer (b) not having any energy ray-curable groups (that is, the total amount of the energy ray-curable component (a) and the polymer (b) not having any energy ray-curable groups in the curable resin film 10) to the total amount of the components other than the solvent is preferably 5% to 90% by mass, more preferably 10% to 80% by mass, and particularly preferably 20% to 70% by mass. When the ratio of the amount of the energy ray-curable component is in the above-described range, the energy ray-curing property of the curable resin film 10 becomes more favorable.

The energy ray-curable resin composition (IV-1) may also contain, in addition to the energy ray-curable component, one or more types of elements selected from the group consisting of a thermosetting component, a photopolymerization initiator, a filler, a coupling agent, a crosslinking agent, and a versatile additive depending on the purpose. For example, when the energy ray-curable resin composition (IV-1) containing the energy ray-curable component and a thermosetting component is used, the adhesive force of the curable resin film 10 to be formed to adherends improves by heating, and the strength of the first protective film 1a formed of this curable resin film 10 also improves.

As the thermosetting component, the photopolymerization initiator, the filler, the coupling agent, the crosslinking agent, and the versatile additive in the energy ray-curable resin composition (IV-1), it is possible to exemplify those which are the same as the thermosetting component (B), the photopolymerization initiator (H), the filler (D), the coupling agent (E), the crosslinking agent (F), and the versatile additive (I) in the energy ray-curable resin composition (III-1).

In the energy ray-curable resin composition (IV-1), one type of each of the thermosetting component, the photopolymerization initiator, the filler, the coupling agent, the crosslinking agent, and the versatile additive may be used singly or two or more types thereof may be jointly used, and, in a case in which two or more types thereof are used, the combination and ratio thereof can be arbitrarily selected.

The amounts of the thermosetting component, the photopolymerization initiator, the filler, the coupling agent, the crosslinking agent, and the versatile additive in the energy ray-curable resin composition (IV-1) may be appropriately adjusted depending on the purpose and are not particularly limited.

From the viewpoint that the handling property of the energy ray-curable resin composition (IV-1) improves by dilution, it is preferable that the energy ray-curable resin composition (IV-1) further contains a solvent.

Examples of the solvent contained in the energy ray-curable resin composition (IV-1) include the same solvent as that in the energy ray-curable resin composition (III-1).

The energy ray-curable resin composition (IV-1) may contain only one type or two or more types of the solvents.

{{Other Components}}

In the energy ray-curable resin composition used for the curable resin film 10 of the present invention, in addition to the above-described energy ray-curable component, similar to the case of the curable resin film 1 containing the thermosetting component described above, the components other than the curable component, that is, an appropriate amount of a curing accelerator (C), a filler (D), a coupling agent (E) and the like can be contained.

In addition, even in the curable resin film 10 formed of the energy ray-curable resin composition, the same action as that of the curable resin film 1 can be obtained by containing components other than the above-described energy ray-curable component.

{{Method of Manufacturing of Energy Ray-Curable Resin Composition}}

The energy ray-curable resin composition such as energy ray-curable resin composition (IV-1) can be obtained by blending individual components for constituting the first interlayer forming composition.

The addition order during the blending of the respective components is not particularly limited, and two or more types of components may be added at the same time.

In a case in which the solvent is used, the solvent may be used by mixing the solvent with all of the blending components other than the solvent so as to dilute these blending components in advance or may be used by mixing the solvent with the blending components without diluting all of the blending components other than the solvent in advance.

A method for mixing the respective components during blending is not particularly limited and may be appropriately selected from well-known methods such as a method in which the components are mixed together by rotating a stirring stick, a stirring blade, or the like; a method in which the components are mixed together using a mixer, and a method in which the components are mixed together by applying ultrasonic waves thereto.

The temperature and the time during the addition and mixing of the respective components are not particularly limited as long as the respective blending components do not deteriorate and may be appropriately adjusted, but the temperature is preferably 15° C. to 30° C.

<<Method for Manufacturing First Protective Film Forming Sheet>>

The first protective film forming sheets 1A and 10A can be manufactured by sequentially stacking the respective layers described above so as to obtain the corresponding positional relationship. The methods for forming the respective layers are as described above.

For example, in the manufacturing of the first supporting sheet 11, in a case in which the first pressure-sensitive adhesive layer or the first interlayer is stacked on the first base material, the first pressure-sensitive adhesive layer or the first interlayer can be stacked by applying the first pressure-sensitive adhesive composition or the first interlayer forming composition described above onto the first base material and drying the composition or irradiating the composition with energy rays as necessary.

Meanwhile, for example, in a case in which the curable resin film is further stacked on the first pressure-sensitive adhesive layer that has been stacked on the first base material, the curable resin film can be directly formed by applying the thermosetting resin composition or the energy ray-curable protective film forming composition on the first pressure-sensitive adhesive layer. Similarly, in a case in which the first pressure-sensitive adhesive layer is further stacked on the first interlayer that has been stacked on the first base material, the first pressure-sensitive adhesive layer can be directly formed by applying the first pressure-sensitive adhesive composition onto the first interlayer. As described above, in a case in which a stacking structure of two continuous layers is formed using any compositions, it is possible to newly form a layer by further applying the composition onto a layer formed of the above-described composition. Here, the stacking structure of two continuous layers is preferably formed by forming, between these two layers, the layer which is stacked from the back on a separate peeling film in advance using the above-described composition and attaching the exposed surface opposite to the surface of the already-formed layer in contact with the peeling film to the exposed surface of the other layer that has been formed. At this time, the above-described composition is preferably applied onto a peeling-treated surface of the peeling film. The peeling film may be removed as necessary after the formation of the stacking structure.

For example, in a case in which the first protective film forming sheets (the first protective film forming sheet in which the first supporting sheet 11 is a stacked substance of the first base material and the first pressure-sensitive adhesive layer) 1A and 10A formed by stacking the first pressure-sensitive adhesive layer on the first base material and stacking the curable resin layer on the first pressure-sensitive adhesive layer are manufactured, first, the first pressure-sensitive adhesive composition is applied onto the first base material and the applied first base material is dried as necessary or being irradiated with energy rays so as to stack the first pressure-sensitive adhesive layer on the first base material in advance. In addition, the first protective film forming sheets 1A and 10A can be obtained by, separately, applying the thermosetting resin composition or the energy ray-curable protective film forming composition onto the peeling film and drying the applied peeling film as necessary so as to form the curable resin film 1 containing thermosetting components on the peeling film, and attaching the exposed surface of the curable resin film 1 to the exposed surface of the first pressure-sensitive adhesive layer that has been stacked on the first base material so as to stack the curable resin films 1 and 10 on the first pressure-sensitive adhesive layer.

Further, for example, in a case where the first supporting sheet 11 is manufactured by stacking the first interlayer on the first base material, and stacking the first pressure-sensitive adhesive layer on the first interlayer, first, the first interlayer forming composition is applied on the first base material, and dried as necessary so as to stack the first interlayer on the first base material. In addition, separately, the first supporting sheet 11 can be obtained by applying the first pressure-sensitive adhesive composition onto the peeling film, drying or irradiating the first pressure-sensitive adhesive composition with energy rays as necessary so that the first pressure-sensitive adhesive layer is formed on the peeling film, and then attaching the exposed surface of the first pressure-sensitive adhesive layer to the exposed surface of the first interlayer that has been stacked on the first base material so as to stack the first pressure-sensitive adhesive layer on the first interlayer. In this case, the first protective film forming sheets 1A and 10A can be obtained by, for example, separately, further applying the thermosetting resin composition or the energy ray-curable protective film forming composition onto the peeling film and drying the thermosetting resin composition or the energy ray-curable protective film forming composition as necessary so as to form the curable resin film 1 containing the thermosetting component on the peeling film and attaching the exposed surface of the curable resin layer to the exposed surface of the first pressure-sensitive adhesive layer that has been stacked on the first interlayer so as to stack the curable resin films 1 and 10 on the first pressure-sensitive adhesive layer.

Meanwhile, in a case in which the first pressure-sensitive adhesive layer or the first interlayer is stacked on the first base material, as described above, the first pressure-sensitive adhesive layer or the first interlayer may be stacked on the first base material by, instead of applying the first pressure-sensitive adhesive composition or the first interlayer forming composition onto the first base material, applying the first pressure-sensitive adhesive composition or the first interlayer forming composition onto the peeling film and drying the composition as necessary so as to form the first pressure-sensitive adhesive layer or the first interlayer on the peeling film and attaching the exposed surface of this layer to one surface of the first base material so as to stack the first pressure-sensitive adhesive layer or the first interlayer on the first base material.

In any of the methods, the peeling film may be removed at an arbitrary timing after the formation of the intended stacking structure.

As described above, all of the layers other than the first base material which constitute the first protective film forming sheets 1A and 10A can be stacked using a method in which the layers are formed on the peeling film in advance and attached on a surface of an intended layer, and thus the first protective film forming sheets 1A and 10A may be manufactured by appropriately selecting layers for which the above-described steps are employed as necessary.

Meanwhile, the first protective film forming sheets 1A and 10A is, generally, stored in a state in which the peeling film is attached to the surface of the outermost layer (for example, the curable resin films 1 and 10) on the opposite side to the first supporting sheet 11. Therefore, the first protective film forming sheets 1A and 10A can also be obtained by applying a composition for forming a layer constituting the outermost layer such as thermosetting resin composition or the energy ray-curable protective film forming composition onto the peeling film (preferably the peeling-treated surface thereof) and drying the applied peeling film as necessary so as to form the layer constituting the outermost layer on the peeling film, stacking the remaining layers on the exposed surface on the opposite side to the surface of the layer in contact with the peeling film using any of the above-described methods, and leaving the layers in the attached state without removing the peeling film.

<<Action and Effect>>

As described above, according to the present invention, the curable resin film and the first protective film forming sheet provided with the curable resin film, after optimizing the weight-average molecular weight of the curable component contained in the curable resin film used in for forming the first protective film, when a dimensional relationship between of the first protective film cured under predetermined conditions and the plurality of bumps on a semiconductor wafer having a plurality of bumps of a predetermined dimensional shape and arrangement condition, and thereby the occurrence of the large distortion in the concave shape on the first protective film disposed between the bumps can be suppressed are appropriately defined.

With this, for example, the inspection in a step of manufacturing a semiconductor wafer and the alignment accuracy in a step of dicing the semiconductor wafer into a chip improve.

Therefore, the inspection accuracy and the dicing accuracy in the manufacturing step improve, and a semiconductor package excellent in the reliability can be manufactured.

EXAMPLES

Next, the present invention will be described in more detail by describing examples and comparative examples.

The scope of the present invention is not limited to the examples, and the curable resin film and the first protective film forming sheet according to the present invention can be performed by appropriately changing and modifying within the range without changing the gist of the present invention.

The components used for manufacturing the thermosetting resin composition are indicated below.

Polymer Component

Polymer component (A)-1: An acrylic resin (having a weight-average molecular weight of 800,000 and a glass transition temperature of −28° C.) obtained by copolymerizing butyl acrylate (hereinafter, abbreviated as "BA") (55 parts by mass), methyl acrylate (hereinafter, abbreviated as "MA") (10 parts by mass), glycidyl methacrylate (hereinafter, abbreviated as "GMA") (20 parts by mass), and 2-hydroxyethyl acrylate (hereinafter, abbreviated as "HEA") (15 parts by mass). The mixing ratio of the respective components are indicated in the following Table 1.

Epoxy Resin

Epoxy resin (B1)-1: A liquid bisphenol F type epoxy resin ("YL 983 U" manufactured by Mitsubishi Chemical Corporation); weight-average molecular weight=340

Epoxy resin (B1)-2: A polyfunctional aromatic type epoxy resin ("EPPN-502H" manufactured by Nippon Kayaku Co., Ltd.); weight-average molecular weight=1,000

Epoxy resin (B1)-3: A dicyclopentadiene type epoxy resin ("EPICLON HP-7200" manufactured by DIC Corporation); weight-average molecular weight=600

Thermal Curing Agent

Thermal curing agent (B2)-1: A novolac-type phenolic resin ("BRG-556" manufactured by Showa Denko KK)

Curing Accelerator

Curing accelerator (C)-1: 2-phenyl-4,5-dihydroxymethyl-imidazole ("Curezol 2 PHZ-PW" manufactured by Shikoku Chemicals Corporation)

Filler

Filler (D)-1: A spherical silica modified with an epoxy group ("Admanano Y A 050 C-MKK" manufactured by Admatechs.); 0.05 μm (average particle diameter); 19% by mass (content ratio in thermosetting resin composition)

Example 1

<Manufacturing of First Protective Film Forming Sheet (Curable Resin Film)>

(Manufacturing of Thermosetting Resin Composition)

The polymer component (A)-1, the epoxy resin (B1)-1, the epoxy resin (B1)-2, the epoxy resin (B1)-3, the thermal curing agent (B2)-1, the curing accelerator (C)-1, and the filler (D)-1 were dissolved and dispersed in methyl ethyl ketone such that the ratio of the amount to the total amount of all components other than the solvent is the value indicated in the following Table 1 (described as "content ratio" in Table 1), and stirred at 23° C. so as to obtain a thermosetting resin composition (III-1) having a solid content concentration of 55% by mass as a thermosetting resin composition.

(Manufacturing of Pressure-Sensitive Adhesive Resin (I-2a))

2-ethylhexyl acrylate (hereinafter, abbreviated as "2EHA") (80 parts by mass) and HEA (20 parts by mass) were set as raw materials of a copolymer, and then a polymerization reaction was performed so as to obtain an acrylic polymer.

2-methacryloyloxyethyl isocyanate (hereinafter, abbreviated as "MOI") (22 parts by mass, approximately 80 mol % to HEA) was added to the acrylic polymer, and an addition reaction was performed at 50° C. for 48 hours in an air stream so as to obtain a target pressure-sensitive adhesive resin (I-2a).

(Manufacturing of First Pressure-Sensitive Adhesive Composition)

As an isocyanate crosslinking agent, a tolylene diisocyanate trimer adduct of trimethylolpropane was added to the pressure-sensitive adhesive resin (I-2a) (100 parts by mass) obtained above, ("Coronate L" manufactured by Tosoh Corporation) (0.5 parts by mass) and stirred at 23° C. so as to obtain a first pressure-sensitive adhesive composition (I-2) having a solid content concentration of 30% by mass, as the first pressure-sensitive adhesive composition. Note that, the number of compounding parts in this "Manufacturing of First Pressure-Sensitive Adhesive Composition" is all in terms of solid content.

(Manufacturing of First Protective Film Forming Sheet)

The above-obtained first pressure-sensitive adhesive composition was applied onto a peeling-treated surface of a peeling film ("SP-PET381031" manufactured by Lintec Corporation, thickness: 38 μm) obtained by carrying out a peeling treatment on a single surface of a polyethylene terephthalate film with a silicone treatment and was heated and dried at 120° C. for 2 minutes, thereby forming a 100 μm-thick first pressure-sensitive adhesive layer.

Next, a 105 μm-thick stacked film formed by stacking a polyolefin film (thickness: 25 μm), an adhesive layer (thickness: 2.5 μm), a polyethylene terephthalate film (thickness: 50 μm), an adhesive layer (thickness: 2.5 μm), and a polyolefin film (thickness: 25 μm) in this order was attached as a first base material to an exposed surface of the first pressure-sensitive adhesive layer in one pressure-sensitive adhesive sheet, thereby obtaining a first supporting sheet.

The above-obtained thermosetting resin composition was applied onto a peeling-treated surface of a peeling film ("SP-PET381031" manufactured by Lintec Corporation, thickness: 38 μm) obtained by carrying out a peeling treatment on a single surface of a polyethylene terephthalate film with a silicone treatment and was dried at 100° C. for 2 minute, thereby forming a 40 μm-thick thermosetting curable resin film.

Next, the peeling film was removed from the first pressure-sensitive adhesive layer of the above-obtained first supporting sheet, an exposed surface of the curable resin film obtained above was attached to an exposed surface of the first pressure-sensitive adhesive layer, thereby obtaining the first protective film forming sheet formed by stacking the first base material, the first pressure-sensitive adhesive layer, the curable resin film, and the peeling film in this order in the thickness direction.

<Evaluation of Semiconductor Wafer After Forming Protective Film>

(Confirmation of Distortion After Curing Curable Resin Film to Form Protective Film)

The first protective film is formed on the bump-formed surface of the semiconductor wafer by using the curable resin film (the first protective film forming sheet) obtained above description.

That is, first, the back surface protective film was attached to the back surface side of the semiconductor wafer provided with the plurality of bumps on the surface, the first protective film forming sheet was attached to the surface side, and the back surface protective film, the semiconductor wafer, and the first protective film forming sheet (curable resin film) were sequentially stacked so as to manufacture a stacked body.

Next, the first pressure-sensitive adhesive layer was exposed by peeling the first supporting sheet from the back surface protective sheet, and the first supporting sheet was attached to an upper surface of a ring frame for wafer dicing such that a stacked body (semiconductor wafer) was fixed and the first supporting sheet was peeled from the first protective film forming sheet.

Subsequently, while applying a pressure of 0.5 MPa to the curable resin film on the semiconductor wafer fixed to the ring frame for wafer dicing, using a pressure and thermal curing apparatus ("RAD-9100" manufactured by Lintec Corporation), the curable resin film was heated at a set temperature of 180° C. for one hour so as to be softened and then cured so as to form the first protective film.

In addition, when the longitudinal section of the semiconductor wafer after forming the protective film was observed by the scanning electron microscope, and as shown in FIGS. 1A and 1B, the average peak height $h1$ of the plurality of bumps, the average thickness $h2$ of the first protective film at the position being in contact with the plurality of bumps, and the average thickness $h3$ of the first protective film at the center position between the plurality of bumps were measured by image analysis with the scanning electron microscope. Further, from these $h1$ to $h3$, "the ratio ($h3/h1$) of the average thickness $h3$ of the first protective film at the center position between the plurality of bumps to the average peak height $h1$ of the plurality of bumps" and "the ratio ($h2/h1$) of the average thickness $h2$ of the first protective film at the position being in contact with the plurality of bumps to the average peak height $h1$ of the plurality of bumps" were calculated, and the results are indicated in Table 2.

As indicated in the following Table 2, in Example 1, it was possible to confirmed that after forming the first protective film by curing the curable resin film, the ratio ($h3/h1$) of the average thickness $h3$ of the first protective film at the center position between the plurality of bumps to the average peak height $h1$ of the plurality of bumps, and the ratio ($h2/h1$) of the average thickness $h2$ of the first protective film at the position being in contact with the plurality of bumps satisfied the relationship represented by the following expression $\{\{(h2/h1)-(h3/h1)\} \leq 0.1\}$. In Example 1, it was possible to confirm that the value calculated on the left side of the above expression was 0.06, and a flat-like first protective film in which the distortion is suppressed was formed.

<Manufacture and Evaluation of First Protective Film Forming Sheet>

Example 2 and Comparative Examples

A first protective film forming sheet of Example 2 was manufactured by using the same method as that used in Example 1 except that the thickness of the first pressure-sensitive adhesive layer on the first protective film forming sheet was set to be 80 μm, and the thickness of the curable resin film was set to be 60 μm, and the evaluation was performed as described above. The results are indicated in Table 2.

Further, a first protective film forming sheet of Comparative Example 1 was manufactured by using the same method as that used in Example 1 except that the thickness of the first pressure-sensitive adhesive layer on the first protective film forming sheet was set to be 60 μm, and the thickness of the curable resin film was set to be 80 μm, and the evaluation was performed as described above. The results are indicated in Table 2.

As indicated in the following Table 2, in Example 2, it was possible to confirmed that after forming the first protective film by curing the curable resin film, the ratio ($h3/h1$) of the average thickness $h3$ of the first protective film at the center position between the plurality of bumps to the average peak height $h1$ of the plurality of bumps, and the ratio ($h2/h1$) of the average thickness $h2$ of the first protective film at the position being in contact with the plurality of bumps satisfied the relationship represented by the following expression $\{(h2/h1)-(h3/h1)\} \leq 0.1$. In addition, in Example 2, it was possible to confirm that the value calculated on the left side of the above expression was 0.09, and the first protective film on which a large distortion in a concave shape was suppressed was formed.

In contrast, in comparative examples, the above-described ($h3/h1$) and ($h2/h1$) did not satisfy the next expression $\{(h2/h1)-(h3/h1)\} \leq 0.1$. In the comparative examples, it was possible to confirm that the value calculated on the left side of the above expression was 0.19, and a large distortion in a concave shape occurred.

TABLE 1

| Contained component (ratio of the content (parts by mass)) of thermosetting resin composition | | | Examples 1, 2, Comparative Example |
|---|---|---|---|
| Contained component | Polymer component | (A)-1 | 100 |
| (ratio of the content | Epoxy resin | (B1)-1 | 135 |
| (parts by mass)) of | | (B1)-2 | 90 |
| thermosetting resin | | (B1)-3 | 150 |
| composition | Thermal curing agent | (B2)-1 | 180 |
| | Curing accelerator | (C)-1 | 1 |
| | Filler | (D)-1 | 160 |

TABLE 2

| | | | Examples | | Comparative |
|---|---|---|---|---|---|
| | | | 1 | 2 | Example |
| First protective film forming sheet | Curable resin film | Thickness (μm) | 40 | 60 | 80 |
| | | Weight-average molecular weight of curable component | 340~1,000 | 340~1,000 | 340~1,000 |
| | | Average particle diameter of filler (D) (μm) | 0.05 | 0.05 | 0.05 |
| | | Amount of filler (D) (% by mass) | 19 | 19 | 19 |
| | First supporting sheet | Thickness (μm) | 105 | 105 | 105 |
| | First pressure-sensitive adhesive layer | Thickness (μm) | 100 | 80 | 60 |
| Evaluation results | Height $h1$ of bump (μm) | | 200 | 200 | 200 |
| | Average thickness $h2$ of first protective film at position being in contact with a plurality of bumps (μm) | | 116 | 144 | 176 |
| | Average thickness $h3$ of first protective film at center position between with a plurality of bumps (μm) | | 104 | 126 | 138 |
| | ($h2/h1$) − ($h3/h1$) | | 0.06 | 0.09 | 0.19 |

From the results of the above-described examples, as defined in the present invention, after optimizing the weight-average molecular weight of the curable component contained in the curable resin film used in for forming the first protective film, when a dimensional relationship between of the first protective film cured under predetermined conditions and the plurality of bumps on a semiconductor wafer having the plurality of bumps of a predetermined dimensional shape and arrangement condition are appropriately set, and thereby the occurrence of the large distortion in the concave shape on the first protective film disposed between the bumps can be suppressed. Therefore, it is possible to improve the inspection accuracy and the dicing accuracy in the manufacturing step and to manufacture a semiconductor package excellent in the reliability.

INDUSTRIAL APPLICABILITY

The present invention can be used for manufacturing a semiconductor chip or the like having a bump at a connection pad portion used in a flip chip mounting method.

REFERENCE SIGNS LIST 1,10 . . . CURABLE RESIN FILM
1a . . . FIRST PROTECTIVE FILM
1A, 1B, 1C . . . FIRST PROTECTIVE FILM FORMING SHEET,
11, 11A, 11B . . . FIRST SUPPORTING SHEET
11a . . . ONE SURFACE (FIRST SUPPORTING SHEET)
12 . . . FIRST BASE MATERIAL,
12a . . . SURFACE (FIRST BASE MATERIAL)
13 . . . FIRST PRESSURE-SENSITIVE ADHESIVE LAYER,
13a . . . SURFACE (FIRST PRESSURE-SENSITIVE ADHESIVE LAYER),
14 . . . FIRST INTERLAYER,
5 . . . SEMICONDUCTOR WAFER,
5a . . . SURFACE (BUMP-FORMED SURFACE: CIRCUIT SURFACE),
5b . . . BACK SURFACE
51 . . . BUMP
51a . . . SURFACE (SURFACE OF BUMP)

What is claimed is:

1. A method of forming a first protective film on a surface of a semiconductor wafer having a plurality of bumps, the method comprising:
   providing the bumps directly on the surface of the semiconductor wafer, the plurality of bumps having an average peak height $h1$ of 50 to 400 μm, an average diameter D of 60 to 500 μm in plan view and an average pitch P of 100 to 800 μm, providing a curable resin film for forming the first protective film, the curable resin film containing an epoxy-based thermosetting component with a weight-average molecular weight of 200 to 4,000 as a curable component, attaching the curable resin film to the surface of the semiconductor wafer, and curing the curable resin film by heating the curable resin film at 100° C. to 200° C. for 0.5 to 3 hours, to form the first protective film on the surface of the semiconductor wafer, the first protective film having a ratio ($h3/h1$) of an average thickness h3 of the first protective film at a center position between the plurality of bumps to the average peak height h1 of the plurality of bumps, and a ratio ($h2/h1$) of an average thickness h2 of the first protective film at a position being in contact with the plurality of bumps to the average peak height h1 satisfying a relationship represented by the Expression (1) below in longitudinal sections of the first protective film and the semiconductor wafer having the plurality of bumps observed by a scanning electron microscope:

$$\{(h2/h1)-(h3/h1)\} \leq 0.1 \tag{1}$$

2. The method of forming a first protective film according to claim 1,
wherein the curable resin film contains 5% to 80% by mass of a filler having an average particle diameter of 5 to 1,000 nm.

3. The method of forming a first protective film according to claim 1,
wherein the curable resin film has a thickness of 5 to 75 μm.

4. The method of forming a first protective film according to claim 1,
wherein the curable resin film has a thickness of 40 to 60 μm.

5. A method of forming a first protective film on a surface of a semiconductor wafer having a plurality of bumps, the method comprising:
providing the bumps directly on the surface of the semiconductor wafer, the plurality of bumps having an average peak height h1 of 50 to 400 μm, an average diameter D of 60 to 500 μm in a plan view and an average pitch P of 100 to 800 μm, providing a curable resin film for forming the first protective film, the curable resin film containing an energy ray-curable component with a weight-average molecular weight of 200 to 4,000 as a curable component, attaching the curable resin film to the surface of the semiconductor wafer, and curing the curable resin film by irradiating the curable resin film with energy rays under a condition of illuminance of 50 to 500 mW/cm2, and light intensity of 100 to 2,000 mJ/cm2, to form the first protective film on the surface of the semiconductor wafer, the first protective film having a ratio ($h3/h1$) of an average thickness h3 of the first protective film at a center position between the plurality of bumps to the average peak height h1 of the plurality of bumps, and a ratio ($h2/h1$) of an average thickness h2 of the first protective film at a position being in contact with the plurality of bumps to the average peak height h1 satisfying a relationship represented by the Expression (1) below in longitudinal sections of the first protective film and the semiconductor wafer having the plurality of bumps observed by a scanning electron microscope:

$$\{(h2/h1)-(h3/h1)\} \leq 0.1 \tag{1}$$

6. The method of forming a first protective film according to claim 5,
wherein the curable resin film contains 5% to 80% by mass of a filler having an average particle diameter of 5 to 1,000 nm.

7. The method of forming a first protective film according to claim 5,
wherein the curable resin film has a thickness of 5 to 75 μm.

8. The method of forming a first protective film according to claim 5,
wherein the curable resin film has a thickness of 40 to 60 μm.

* * * * *